(12) United States Patent
    Desbiens

(10) Patent No.: US 9,236,707 B1
(45) Date of Patent: Jan. 12, 2016

(54) SYSTEM AND METHOD FOR GENERATING LIGHT PULSES BASED ON DIRECT CURRENT MODULATION OF A SEED LASER DIODE

(71) Applicant: INSTITUT NATIONAL D'OPTIQUE, Quebec (CA)

(72) Inventor: Louis Desbiens, Quebec (CA)

(73) Assignee: Institut National D'Optique, Quebec, Quebec (CA)

( * ) Notice: Subject to any disclaimer, the term of this patent is extended or adjusted under 35 U.S.C. 154(b) by 0 days.

(21) Appl. No.: 14/616,161

(22) Filed: Feb. 6, 2015

(51) Int. Cl.
| | |
|---|---|
| *H01S 3/10* | (2006.01) |
| *H01S 5/042* | (2006.01) |
| *H01S 5/0625* | (2006.01) |
| *H01S 5/065* | (2006.01) |
| *H01S 5/183* | (2006.01) |
| *H01S 5/125* | (2006.01) |
| *H01S 5/022* | (2006.01) |
| *H01S 5/00* | (2006.01) |
| *H01S 5/0683* | (2006.01) |
| *H01S 3/00* | (2006.01) |
| *H01S 5/12* | (2006.01) |
| *H01S 5/187* | (2006.01) |

(52) U.S. Cl.
    CPC ............ *H01S 5/0427* (2013.01); *H01S 3/0057* (2013.01); *H01S 5/0057* (2013.01); *H01S 5/02248* (2013.01); *H01S 5/0428* (2013.01); *H01S 5/0656* (2013.01); *H01S 5/06253* (2013.01); *H01S 5/06835* (2013.01); *H01S 5/125* (2013.01); *H01S 5/183* (2013.01); *H01S 5/12* (2013.01); *H01S 5/1228* (2013.01); *H01S 5/187* (2013.01)

(58) Field of Classification Search
    CPC ... H01S 5/0057; H01S 5/0427; H01S 5/0428; H01S 5/06835; H01S 5/12; H01S 5/1228; H01S 5/125; H01S 5/187; H01S 3/0057
    USPC .......................... 372/25, 5, 29.011, 30, 29.02
    See application file for complete search history.

(56) References Cited

U.S. PATENT DOCUMENTS

| | | |
|---|---|---|
| 5,633,885 A | 5/1997 | Galvanauskas et al. |
| 8,073,027 B2 | 12/2011 | Deladurantaye et al. |
| 8,761,215 B2 | 6/2014 | Jacob et al. |

(Continued)

OTHER PUBLICATIONS

Peucheret, C., Direct current modulation of semiconductor lasers, Introduction to Optical Communication, http://www.cpeu.dk/data/uploads/teaching/34130_e2011_cpeu_dml_sim.pdf, 2011.

(Continued)

*Primary Examiner* — Kinam Park
(74) *Attorney, Agent, or Firm* — Merchant & Gould P.C.

(57) ABSTRACT

A system and method generate laser pulses. Using the modulation signal from a pulse generation module, a seed laser diode generates seed light pulses in response to direct drive current modulation. The seed light pulses have a pulse duration longer than a target pulse duration and a spectral chirp. A compression module has dispersion characteristics over a broad spectral range. The pulse generation module is configured to adapt the modulation signal to tailor the spectral chirp of the seed light pulses in view of the dispersion characteristics of the compression module, such that propagation of the seed light pulses through the compression module compresses the seed pulses into output light pulses having the target pulse duration.

20 Claims, 18 Drawing Sheets

(56) References Cited

U.S. PATENT DOCUMENTS

| | | | |
|---|---|---|---|
| 2005/0041702 A1* | 2/2005 | Fermann | B23K 26/063 372/25 |
| 2006/0078338 A1 | 4/2006 | Johnson et al. | |
| 2011/0280265 A1* | 11/2011 | Desbiens | H01S 5/0428 372/38.02 |
| 2012/0062984 A1* | 3/2012 | Tong | H01S 3/0057 359/337.2 |
| 2014/0112361 A1 | 4/2014 | Njegovec et al. | |

OTHER PUBLICATIONS

Fermann et al., Ultrafast Lasers, Technology and Applications, Marcel Dekker, Inc., NewYork, 2003, pp. 156-158.

Durkin, M., 1m long continuously-written fire Bragg gratings for combined second- and third-order dispersion compensation, IEEE Electron. Lett., 33, 22, 1997.

Deladurantaye et al., Ultra stable, industrial green tailored pulse fiber laser with diffraction-limited beam quality for advanced micromachining, Journal of Physics: conference Series, vol. 276, Art. No. 012017, 2011.

Desbiens, L., Amplification d'impulsions femtosecondes à 1550 nm en régime de dispersion anomale, PhD Diss., Université Laval, 2009, http://www.theses.ulaval.ca/2009/26978/26978.pdf.

Yang, Z., Pulse-shaping to reduce the chirping effects of DFB laser diodes and pulse broadening, Thesis, electrical engineering, University of Arizona, 1992.

Gagne, M. et al., Fabrication of high quality, ultra-long fiber Gragg gratings: up to 2 million periods in phase, Opt. Express 22, 387-398, 2014.

* cited by examiner

SYSTEM AND METHOD FOR GENERATING LIGHT PULSES BASED ON DIRECT CURRENT MODULATION OF A SEED LASER DIODE

FIELD OF THE INVENTION

The present invention relates to the field of pulsed lasers and more generally concerns a method and system for generating light pulses having a target pulse duration, for example in the picosecond or femtosecond range, using direct current modulation of a seed laser diode.

BACKGROUND

Light pulses of duration in the picosecond or femtosecond range, often referred to as "ultrashort" light pulses, are desired in a variety of applications, such as for example in the laser micromachining/processing and biomedical fields. Among other features, it can be advantageous for the optical sources emitting such light pulses to be flexible, allowing customization and easy tuning of parameters such as the pulse duration, repetition rate and spectral contents. The generation of light pulses "on-demand" can also be a desirable feature for some applications.

Various types of laser sources apt to produce ultrashort light pulses are known in the art. For example, mode-locked lasers can produce pulses as short as 10 fs. Their use in some contexts is however limited by their inherently fixed pulse repetition rate, typically in the MHz range. Mode-locked lasers may also lack the reliability required in several industrial applications. By contrast, Q-switch lasers are known to be very reliable as well as able to provide pulses of high peak power. Drawbacks of Q-switching technology however include limited adaptability in wavelength, low pulse repetition rates and minimum pulse durations around 10 ps. Also known in the art are gain-switched semiconductor lasers, providing relatively long pulses of around 50 to 100 ps. Such lasers can be operated on-demand, but the minimum pulse duration can vary from laser chip to laser chip, and the spectral contents cannot be well controlled.

Modulation of a light outputted by a seed laser diode can be a versatile laser pulse generation scheme. One or more phase or amplitude modulators can be used downstream of a pulsed or CW seed diode and operated to define or refine the temporal characteristics of the seed light. Advantageously, such systems can provide good control on both the temporal shape and spectral contents of the generated light pulses. Such configurations are however typically limited to generating light pulses of about 25-ps duration or longer.

In view of the above, there remains a need for flexible and versatile systems and method for generating ultrashort light pulses.

SUMMARY

In accordance with one aspect, there is provided a method for generating output light pulses having a target pulse duration, using a seed laser diode and using a compression module having dispersion characteristics over a broad spectral range. The method includes the following step:
a) directly modulating a drive current of the seed laser diode with a modulation signal such that the seed laser diode generates seed light pulses having a pulse duration larger than the target pulse duration and a spectral chirp along said pulse duration;
b) adapting the modulation signal to tailor the spectral chirp of the seed light pulses in view of the dispersion characteristics of the compression module; and
c) compressing the seed light pulses into the output light pulses having the target pulse duration through propagation in the compression module.

In accordance with another aspect, there is also provided a laser pulse generating system for generating output light pulses having a target pulse duration. The system first includes a pulse generation module configured to generate a modulation signal. A seed laser diode is further provided and configured to generate seed light pulses in response to direct drive current modulation by the modulation signal. The seed light pulses have a pulse duration larger than the target pulse duration and a spectral chirp along this pulse duration. The system further includes a compression module optically connected to the seed laser diode to receive the seed light pulses. The compression module has dispersion characteristics over a broad spectral range. The pulse generation module is configured to adapt the modulation signal to tailor the spectral chirp of the seed light pulses in view of the dispersion characteristics of the compression module, such that propagation of the seed light pulses through the compression module compresses the seed pulses into said output light pulses having the target pulse duration.

Other features and aspects of the invention will be better understood upon reading of preferred embodiments thereof with reference to the appended drawings.

DESCRIPTION OF EMBODIMENTS

In accordance with aspects of the invention, there are provided methods and system for generating output light pulses having a target pulse duration using direct current modulation of a seed laser diode.

Implementations of methods and systems as described herein may for example be useful to generate ultrashort light pulses, that is, pulses having durations in the range of picoseconds (ps) or femtoseconds (fs). For example, in some implementations the target duration of the output light pulses may be between 100 fs and 50 ps. In other implementations the target duration may be longer, for example in the nanosecond range, in particular for embodiments where the light pulse generation is part of a Chirped Pulse Amplification (CPA) scheme, as will be explained below. It will however be readily understood that output light pulses having a duration out of the above cited ranges may be obtained according to other embodiments without departing from the scope of the present invention. Applications which may benefit from output light pulses such as generated by the methods and systems described herein for example include laser micromachining applications, biomedical applications, etc.

Laser Pulse Generating System

Figure 1:
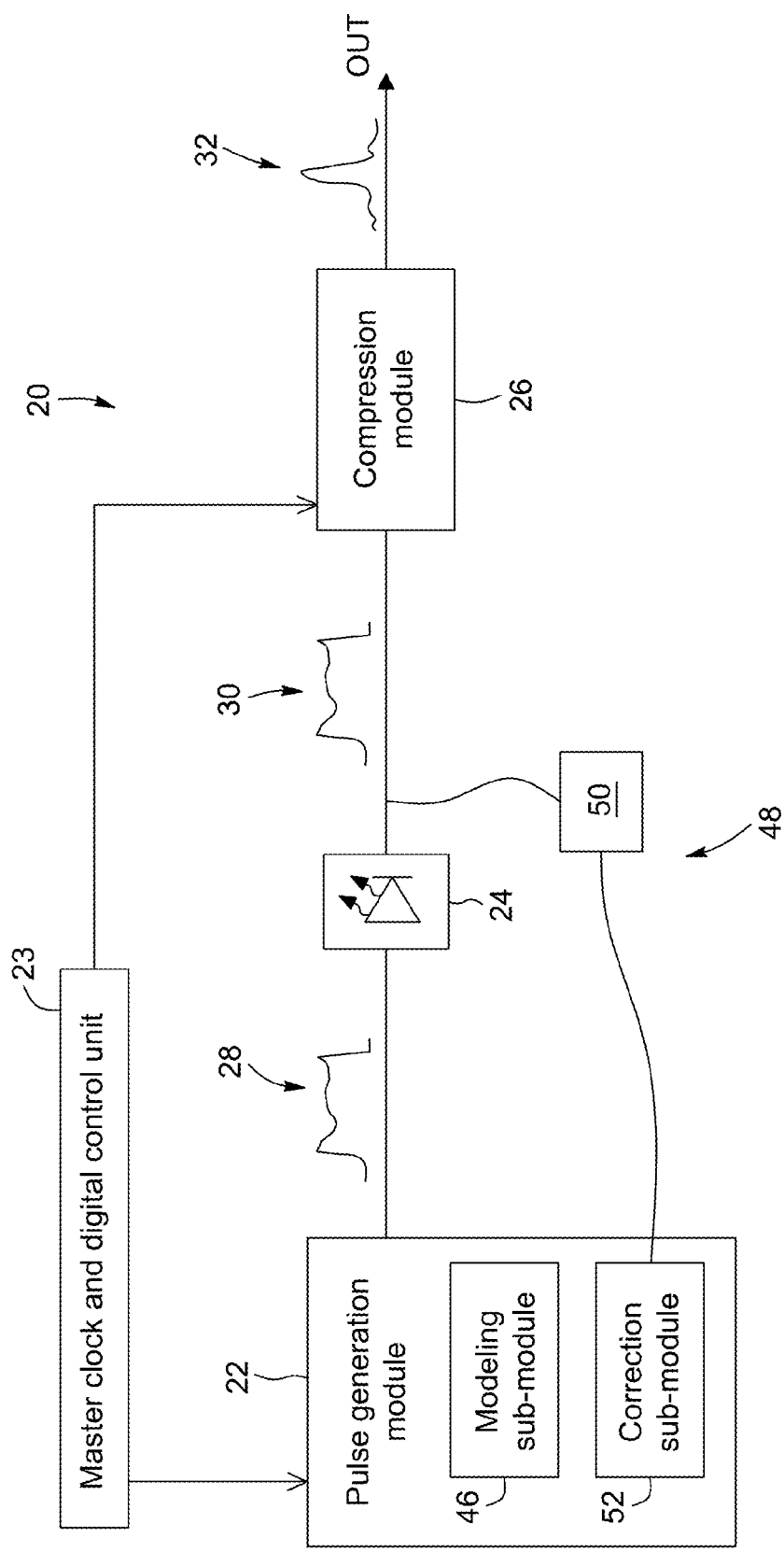
FIG. 1 is a schematized representation of a laser pulse generating system according to an embodiment.

Referring to FIG. 1, the main components of a laser pulse generating system 20 according to one embodiment are schematically illustrated. The system 20 generally includes a pulse generation module 22 configured to generate a modulation signal 28 defining electrical drive pulses, a seed laser diode 24 configured to generate seed light pulses 30 in response to direct drive current modulation by the modulation signal 28, and a compression module 26 compressing the seed pulses 30 into the output light pulses 32.

The expression "laser diode" is understood to refer to a laser relying on a p-n junction of a semiconductor-based gain media. The seed laser diode 24 may be generally embodied by a laser diode of a type providing seed light pulses of controllable temporal and spectral characteristics in response to direct modulation of a current driving the laser diode. In some implementations, it may be preferable for the light generated by the seed laser diode to stay longitudinally single mode independently of the operating temperature of the diode. As will be readily understood by one skilled in the art, this condition applies during the short period of time during which the modulation signal is generated and applied to the seed laser diode. The seed laser diode 24 is able to generate seed light pulses 30 having a pulse duration larger than the target pulse duration. For output light pulses in the picosecond or femtosecond ranges, the duration of the seed light pulses may be in the nanosecond range, for example between 1 and 500 nanoseconds. As will be better understood further below, the seed laser diode 24 also preferably exhibits significant chirping properties, the generated seed light pulses 30 therefore having a spectral chirp along the pulse duration.

In some implementations, the seed laser diode 24 may be embodied by a DFB (Distributed Feedback Laser) laser diode. In other implementations other laser diode technologies such as DBR (Distributed Bragg Reflector) or VCSEL (Vertical-Cavity Surface Emitting Laser) may also be used.

The compression module 26 is optically connected to the seed laser diode 24 to receive the seed light pulses 30. As will be explained in greater details below, the compression module 26 has dispersion characteristics over a broad spectral range. For example, the compression module 26 may include a long Bragg grating (see FIG. 11), reflecting the seed light pulses 30. Long, chirped, fiber Bragg gratings with a length of 1 m or more have been demonstrated in the art. Such a device can be used to compress seed light pulses of about 10 ns to a duration close to the transform-limited duration. In other variants, the compression module may include multiple fiber Bragg gratings or multiple passes of the seed light pulses in one or more Bragg gratings. Further details on such implementations will be given further below.

The pulse generation module 22 is preferably embodied by an electronic device capable of generating an electrical modulation signal apt to modulate at high speed, for example hundreds of MHz of bandwidth, the electrical current circulating in the seed laser diode. As will be readily understood by one skilled in the art, in order to drive the seed laser diode to emit seed light pulses, the modulation signal itself should define the appropriate waveform that will provide the desired temporal and spectral shape for the seed light pulses, in accordance with the transfer function of the pulsing system and the specific response of the seed laser diode to variations in drive current. For more information on this aspect reference can for example be made to U.S. Patent Application Pub. No. US2011/0280265 (DESBIENS et al), the entire contents of which are incorporated herein by reference.

In some implementations, the modulation signal 28 outputted by the pulse generation module 22 may be programmable with a fine time resolution of about 1 ns or less. The time resolution of the pulse generation module directly affects the level of resolution available for the tailoring of the spectral chirp in the seed light pulses produced by the seed laser diode.

An example of such a pulse generation module according to some implementations of the invention is the MOPAW (trademark) platform available from INO (Quebec City, Canada) and having at least some of the characteristics described in the following references: U.S. Pat. No. 8,073,027 (Deladurantaye et al.); U.S. Pat. No. 8,761,215 (Jacob et al.); U.S. Patent Application Pub. No. 2011/0280265 (Desbiens et al.); and P. Deladurantaye, V. Roy, L. Desbiens, M. Drolet, Y. Taillon, and P. Galarneau, "Ultra Stable, Industrial Green Tailored Pulse Fiber Laser with Diffraction-limited Beam Quality for Advanced Micromachining" *Journal of Physics*: Conference Series, Vol. 276, art. No. 012017, (2011). The contents of these documents in their entirety are incorporated herein by reference. Such a device can provide modulation signals driving a laser diode to generate seed light pulses as long as 500 ns, with a temporal control resolution of 1 ns. Advantageously, the amplitude of each temporal bin of 1 ns can be adjusted with great resolution (8192 digital counts) which corresponds approximately to a pitch of 0.1 mA.

It will be readily understood that the pulse generation module 22 may be embodied by a variety of structures, components, modules, sub-modules and the like apt to perform the pulse generation functions described herein. In some embodiments, the pulse generation module may be combined with or integrated into a master clock and digital control unit 23 including an oscillator providing a start-up clock signal as well as other supporting functions. The master clock and digital control unit 23 may include a microcontroller or FPGA chip which may perform a number of control functions such as a digital control and monitoring of the seed laser diode, control of optical devices such as optical switches and modulators, management of communications with a host computer, etc. The master clock and digital control unit 23, the pulse generation module 22 and other electronics of the pulse generation system may advantageously be implemented in a very compact architecture, for example on a single printed circuit board.

The pulse generation module 22 is configured to adapt the modulation signal 28 to tailor the spectral chirp of the seed light pulses 30 in view of the dispersion characteristics of the compression module 26, in such a manner that propagation of the seed light pulses 30 through the compression module 26 compresses the seed light pulses 30 into the desired output light pulses 32 having the target pulse duration.

Advantageously, in embodiments of the invention the spectral chirp of the seed light pulses can be finely controlled in such a way that it matches the variation of the spectral chirp in the seed light pulses with the dispersion of the compression module 26, such that output light pulses as short as possible, for example close to the transform-limited duration, can be obtained. In typical implementations the dispersion of the compression module does not require any special tailoring, as it is the temporal shape of the electrical pulses of the modulation signal driving the seed laser diode which is adapted in order for the spectral chirp of the seed light pulses to be matched to the dispersion of the compression module. Such an approach allows for the dispersion of the compression module to be designed having simplicity and ease of manufacturing in mind.

The expression "spectral chirp" as used herein is understood to refer to the variation of the instantaneous frequency of a light pulse over its duration. The main linear component of the spectral chirp can for example be expressed in GHz/ns. The expression "dispersion" as applied to the compression module is understood to refer to the wavelength derivative of the group delay of the light travelling in the compression module, and its main linear component can for example be expressed in ns/nm. As will be readily understood by one skilled in the art, a match between the spectral chirp of the seed light pulses and the dispersion of the compression module occurs when the compression module affects the delay between different spectral components of the seed light pulses in a manner opposite to the spectral chirp. In other words, the spectral chirp represent the spread of the spectral components over time within the seed light pulses, whereas the dispersion of the compression module, if matched to the spectral chirp of the seed light pulse, regroups these spectral components to generally coincide with each other in time, hence compressing the temporal shape of the pulse.

Method for Generating Output Light Pulses

Figure 2:
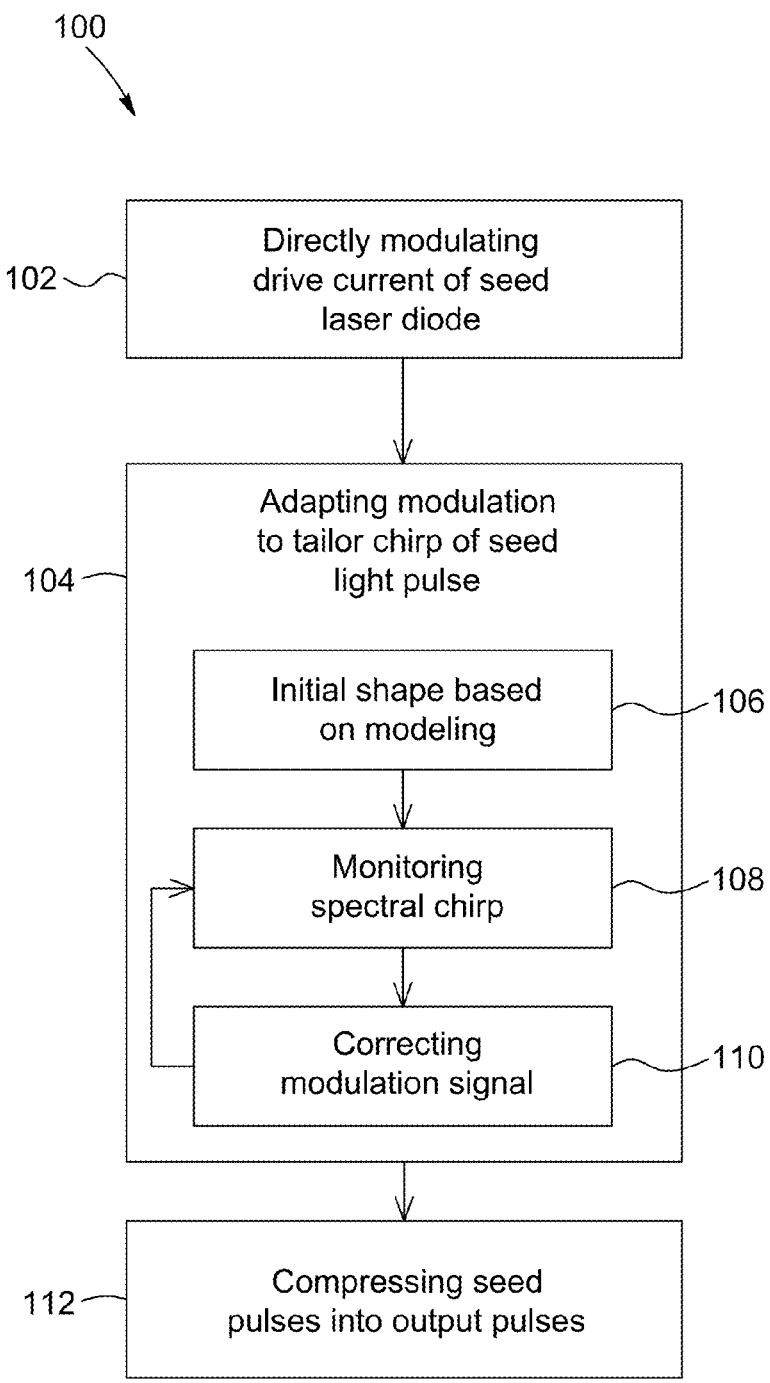
FIG. 2 is a flow chart of a method for generating output light pulses according to an embodiment.

With reference to FIG. 2, a method 100 for generating output light pulses according to an aspect of the present description will now be described in more details.

The method includes a first step of directly modulating 102 the drive current of the seed laser diode with a modulation signal. As will be readily understood by one skilled in the art, the concept of "direct modulation" of a laser diode implies that the amplitude of the drive current of the seed laser diode is varied in order to affect the amplitude of the optical signal emitted by the seed laser diode accordingly. By tailoring the temporal shape of the electrical modulation signal, a desired temporal shape can be obtained for the light pulses emitted by the laser diode.

The modulation signal is adapted such that the seed laser diode generates seed light pulses having desired characteristics, namely a pulse duration larger than the target pulse duration and a spectral chirp along this pulse duration. By finely tailoring the amplitude and temporal shape of seed light pulses, for example at the nanosecond scale, the spectral chirp of the generated seed pulses is also affected.

Figure 3A:
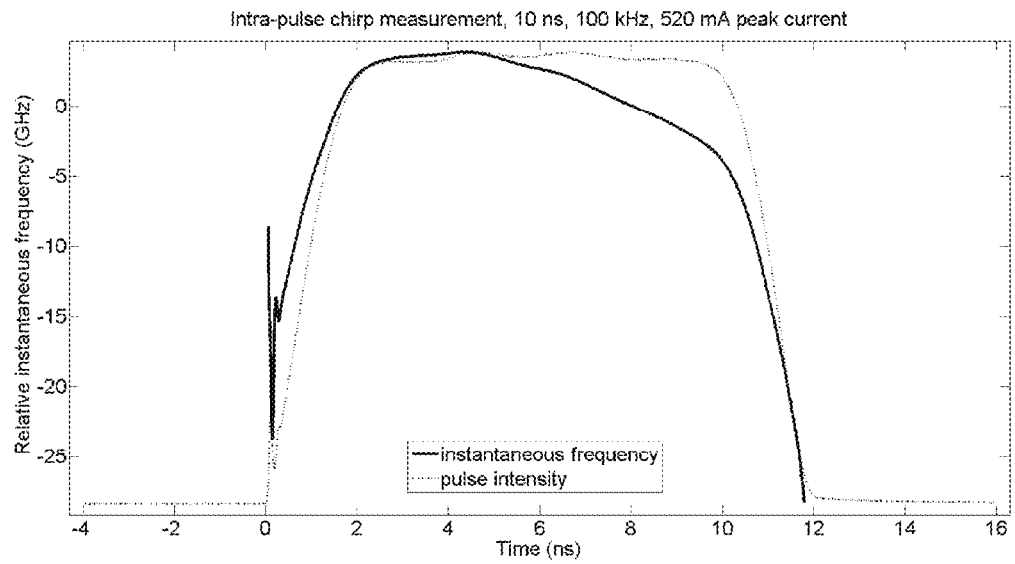
FIGS. 3A to 3C are graphs contrasting the intrapulse intensity and the instantaneous frequency of a seed light pulse generated through direct current modulation of a seed laser diode for different modulation conditions.
Figure 3B:
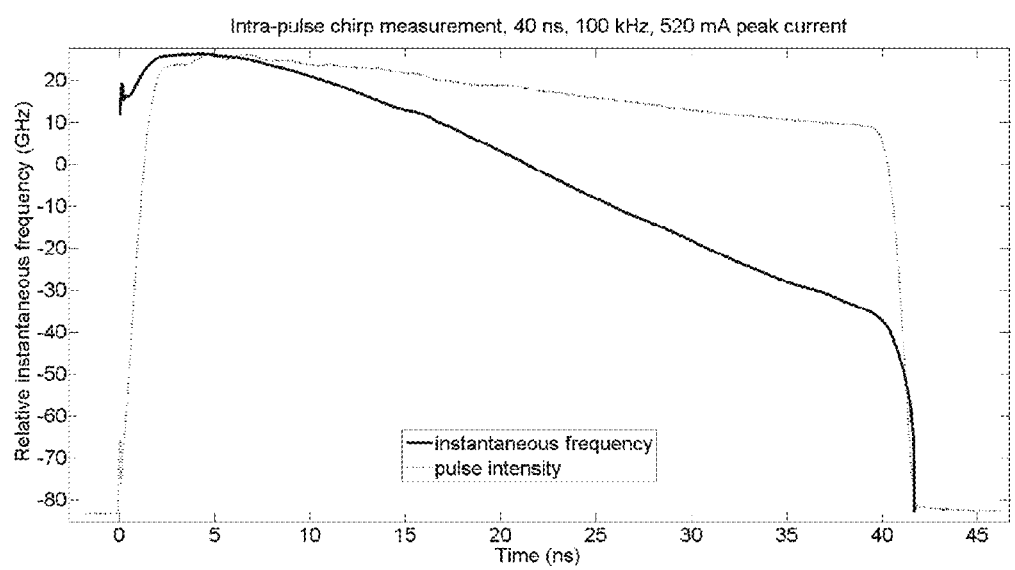
Figure 3C:
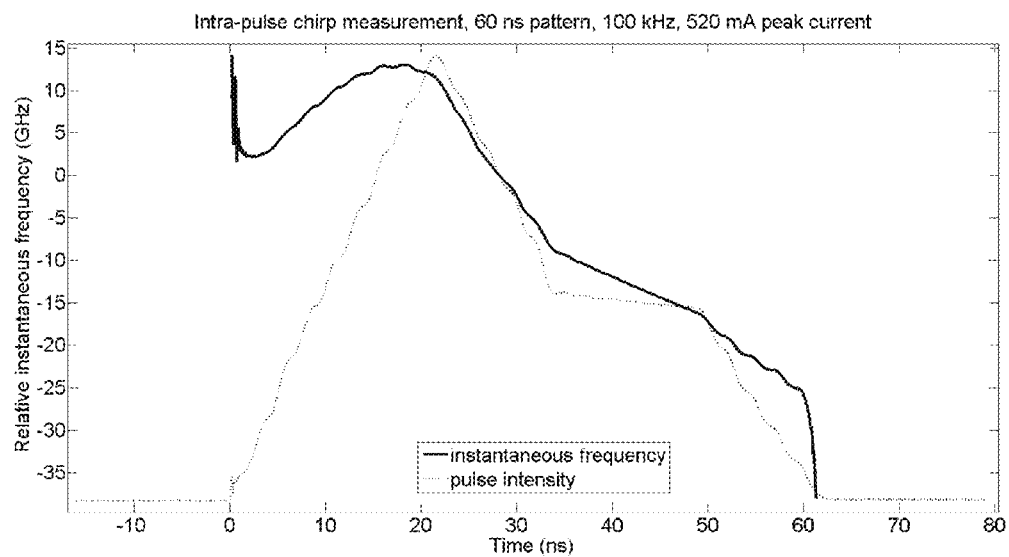

As explained above, the spectral chirp of a light pulse can be defined as a time-variation of the central instantaneous frequency of the light over the pulse duration. As known in the art, the instantaneous frequency of the seed pulses generated by a laser diode under direct current modulation varies over the duration of the pulse. By way of example, FIG. 3A is a graph illustrating both the variation of the pulse intensity of the light generated by the seed diode over time and the variation of the relative instantaneous frequency of this light, for pulses of 10 ns emitted at a rate of 100 kHz with a peak current of 520 mA. As can be seen, while the light intensity is fairly constant over the duration of the pulse, the instantaneous frequency tends to drift as time progresses. FIGS. 3B and 3C contrast the spectral chirp for seed pulses of 40 ns and 60 ns, respectively.

The spectral chirp of a seed pulse can depend on different factors. There are typically three contributors to the chirp obtained from the seed laser diode during the generation of the seed light pulse: transient chirp, adiabatic chirp and thermal chirp.

The transient chirp is proportional to the derivative of the power out of the seed laser diode. This chirp manifests itself mostly on the rising and falling edges of a seed light pulse, where the current variations are the greatest. It can be expressed as:

$$\Delta v_{transient}(t) = \frac{\alpha}{4\pi}\left(\frac{d}{dt}P_L(t)\right) \quad (1)$$

where $\alpha$ is a constant referred to as the linewidth enhancement factor and $P_L$ is the optical power out of the laser diode.

The adiabatic chirp is proportional to the optical power out of the seed laser diode, and can be expressed as:

$$\Delta v_{adiabatic}(t) = \frac{\alpha\kappa}{4\pi}P_L(t) \quad (2)$$

where $\kappa$ is the adiabatic chirp coefficient.

The thermal chirp is of particular relevance to laser diodes having a feedback mechanism incorporated in the chip, such as is the case for typical DFB laser diodes. In such diodes, the temperature increase of the semiconductor junction during the transit of the nanosecond electrical pulse of the modulation signal heats up the feedback mechanism as well, and shifts spectrally the feedback wavelength, producing a significant thermal chirp. The thermal chirp is therefore proportional to the temperature of the feedback mechanism.

Let $P_{th}$ express the thermal power dissipated by the semiconductor device. Its variation as a function of time can be written as:

$$P_{th}(t)=RI(t)^2+V_FI(t)-P_L(t) \qquad (3)$$

where R is the resistance of the diode when in conductivity mode, I is the circulating current and $V_F$ is the forward bias voltage of the diode.

The thermal energy deposited in the semiconductor device is:

$$E_{th}(t) = \int_0^t P_{th}(\tau)d\tau \qquad (4)$$

On the timescale of the duration of the seed light pulse, the temperature of the feedback mechanism increases proportionally to the thermal energy deposited in the diode, but with a slight time delay ($t_{delay}$) associated with the heat propagation. The thermal chirp is therefore proportional to this delayed temperature increase, such that:

$$\Delta v_{thermal}(t)=\kappa_{th}E_{th}(t-t_{delay}) \qquad (5)$$

where $\kappa_{th}$ is the thermal chirp coefficient.

The spectral chirp of the seed diode can be written as the sum of the three chirp components:

$$\Delta v(t)=\Delta v_{transient}(t)+\Delta v_{adiabatic}(t)+\Delta v_{thermal}(t) \qquad (6)$$

For example, the seed diode that was used to obtain the experimental measurements shown in FIG. 3A was a DFB laser made by QDLaser, model QLD1061 (trade name), emitting at a wavelength of 1064 nm. In reproducing the measured spectral chirp of FIG. 3A using the model provided above, the following set of parameters provide satisfactory results:
R=2.6Ω (measured)
Vf=1.23 V (measures)
α=3.016 (fit to the chirp measurement data)
κ=312.5 GHz/W (fit to the chirp measurement data)
$t_{delay}$=5.5 ns (fit to the chirp measurement data)
$\kappa_{th}$=−1.8 GHz/nJ (fit to the chirp measurement data)
Coupling efficiency: 50% (assumption)

Figure 3D:
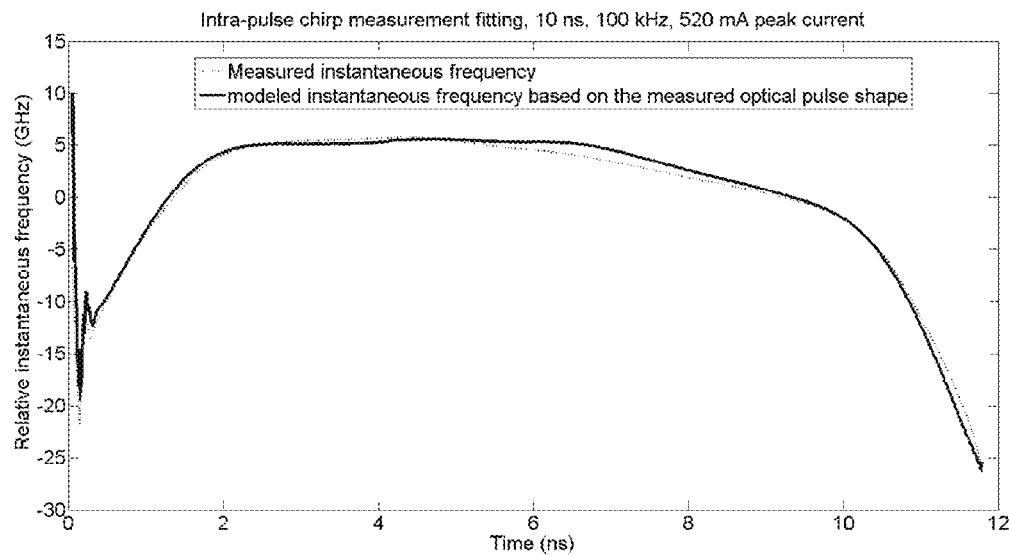
FIG. 3D shows a best-fit solution to reproduce the measured spectral chirp of the seed light pulse of FIG. 3A.

FIG. 3D presents the best fit solution for the modelled chirp, based on the measured optical pulse shape.

Referring back to FIG. 2, the method next involves a step 104 of adapting the modulation signal to tailor the spectral chirp of the seed light pulses in view of the dispersion characteristics of the compression module.

One advantage of tailoring the electrical pulses of the modulation signal instead of the dispersion of the compression module, for example the chirp of a fiber Bragg grating, is the ease and the speed at which adjustments or corrections can be applied. A tailored fiber Bragg grating, once fabricated, offers limited possibilities of adjustment of its chirp. While such adjustments may be possible by generating gradients of temperature, or by applying local mechanical stresses along the fiber Bragg grating, these approaches are not as flexible and as quickly responsive as the direct adjustment of the modulation signal.

For a compression module embodied by a long fiber Bragg grating, the optimal duration of the seed light pulses, allowing the shortest possible light pulses to be obtained at the output of the compression module, is directly proportional to the length of the fiber Bragg grating. The relationship between these two parameters can be written as:

$$L_B = \frac{1}{2}T_{pulse}\frac{c}{n_g}\frac{\Delta v_{Bragg}}{\Delta v_{pulse}} \qquad (7)$$

where $L_B$ is the length of the fiber Bragg grating, $T_{pulse}$ is the optimal duration of the seed light pulse, $n_g$ is the group delay associated with the propagation in the fiber Bragg grating (~1.468 @ 1064 nm in single-mode, step-index fibers made from silica glass), $\Delta v_{pulse}$ is the spectral bandwidth of the seed light pulse and $\Delta v_{Bragg}$ is the spectral bandwidth of the fiber Bragg grating.

By way of example, a 1-m long fiber Bragg grating could fully compress a seed light pulse of up to 10 ns of duration, a 10-m long fiber Bragg grating could compress a seed light pulse of up to 100 ns of duration and so forth. The dispersion of the compression module is therefore selected in view of the desired compression. As will be readily understood by those skilled in the art, obtaining short pulses after compression optimally requires large spectral contents. This therefore involves a broad spectral range for the compression module, and correspondingly long seed light pulses—since the spectral chirp of the seed light pulses is dependent on the pulse energy, the longer the seed light pulse, the higher the seed pulse energy and the larger the spectral contents. Longer seed pulses are also advantageous for facilitating the tailoring of the modulation signal, as the temporal control resolution of this signal can be very limiting for short pulses.

In some embodiments, the spectral range of the compression module is understood to be broad enough to compress seed light pulses in the nanosecond range into output light pulses in the femtosecond to picosecond range. For example, the spectral range of the compression module may be extending from 0.1 nm to 25 nm.

Figure 4:
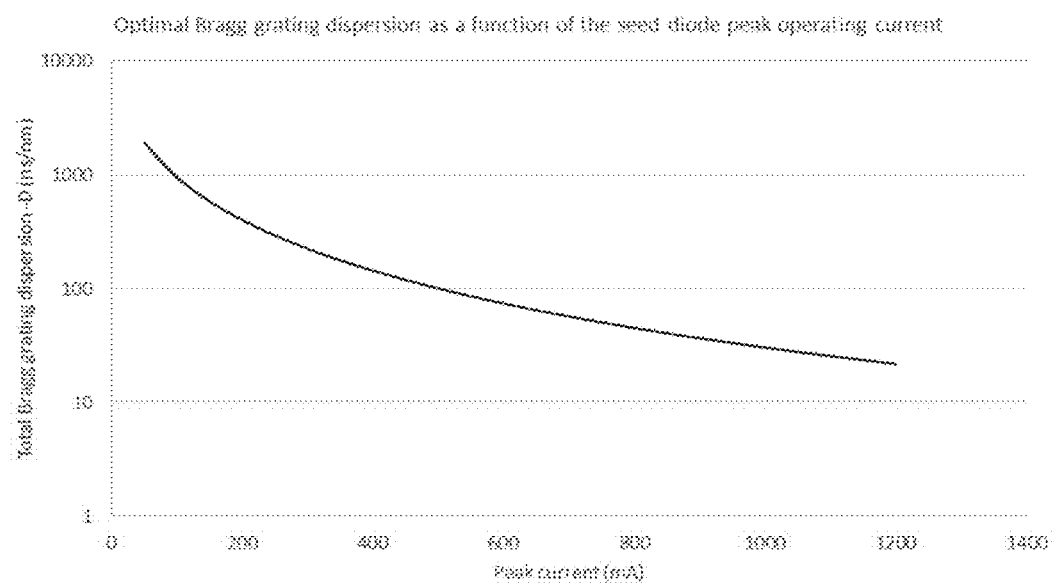
FIG. 4 is a graph of the optimal dispersion value for a fiber Bragg grating depending on the operating peak current for seed light pulse shapes where the thermal chirp is dominant.

For example, through modeling of the specific seed laser diode used in tests performed by the inventors, a thermal chirp value of −1.8 GHz/nJ was obtained. Assuming that the pulse duration is long and the pulse shape is square-like, that is, that the contributions of the adiabatic and transient chirp are negligible and only the thermal chirp remains, then the optimal fiber Bragg grating dispersion will depend mostly on the peak current level at which the seed laser diode is pulsed, as the peak current level affects the thermal power dissipated in the seed laser diode. FIG. 4 illustrates the optimal values obtained in such conditions as a function of the operating current for the specific device used in the tests. The sign of the grating dispersion (D) values plotted in the figure has been reversed since the dispersion of the fiber Bragg grating should be normal (negative-valued), to compensate for the thermal chirp which is equivalent to a propagation in a material having an anomalous dispersion.

In some implementations, a fine tailoring of the electrical pulse shape of the modulation signal can be used to significantly improve the linearity of the spectral chirp of the seed light pulses, as well as their compressibility. As will be readily understood, embodiments where the spectral chirp of the seed light pulses is generally linear can facilitate matching to the dispersion of the compression module. In some embodiments, the spectral chirp of the seed light pulses may for example define a constant chirp rate between −50 and +5 GHz/ns.

Figure 5A:
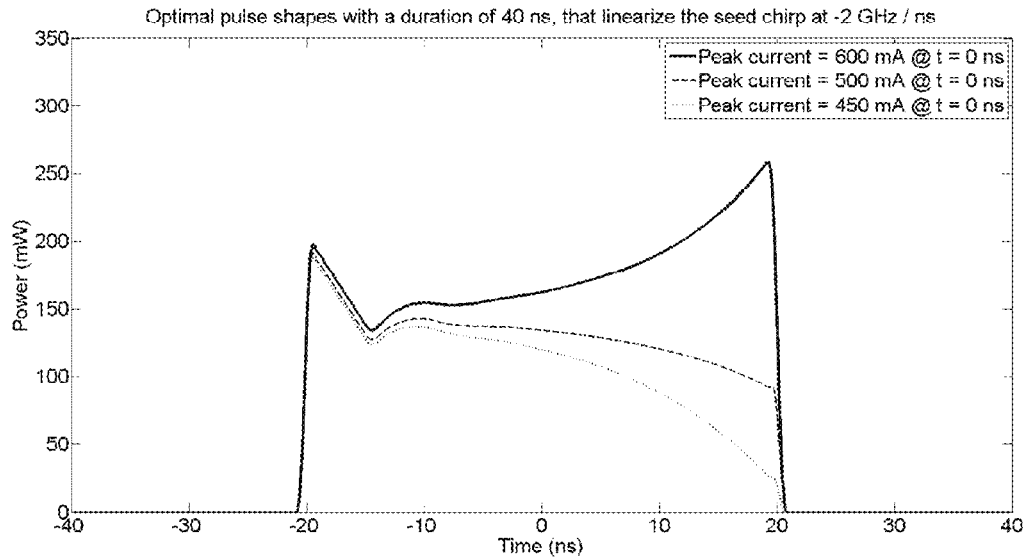
FIGS. 5A and 5B are graphs showing optimal optical pulse shapes iteratively obtained for a constant, linear chirp out of the seed laser diode of respectively −2 GHz/ns (FIG. 5A) and −4 GHz/ns (FIG. 5B) for different peak current levels.
Figure 5B:
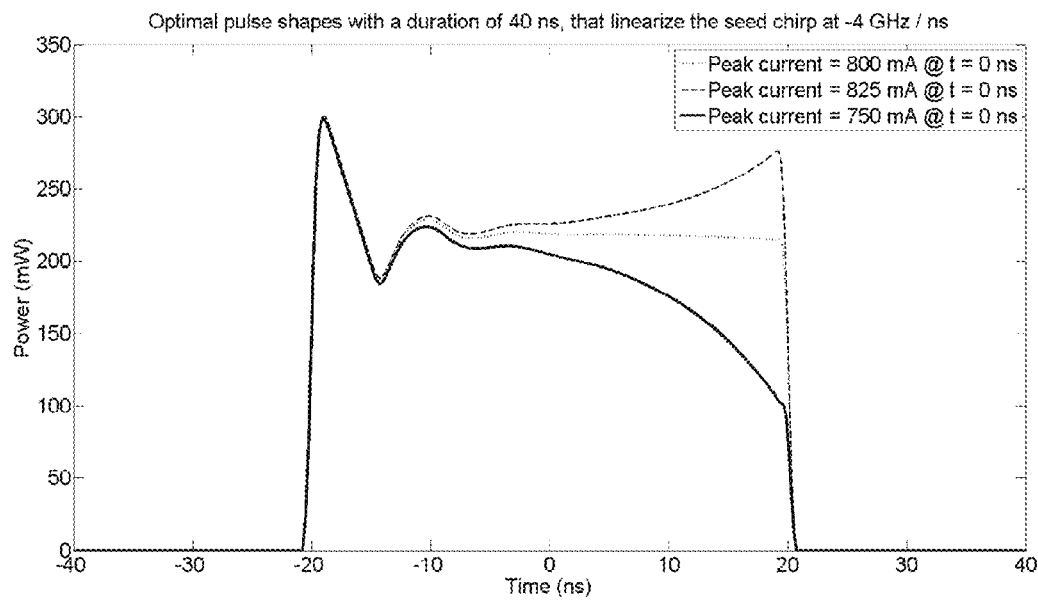
Figure 6:
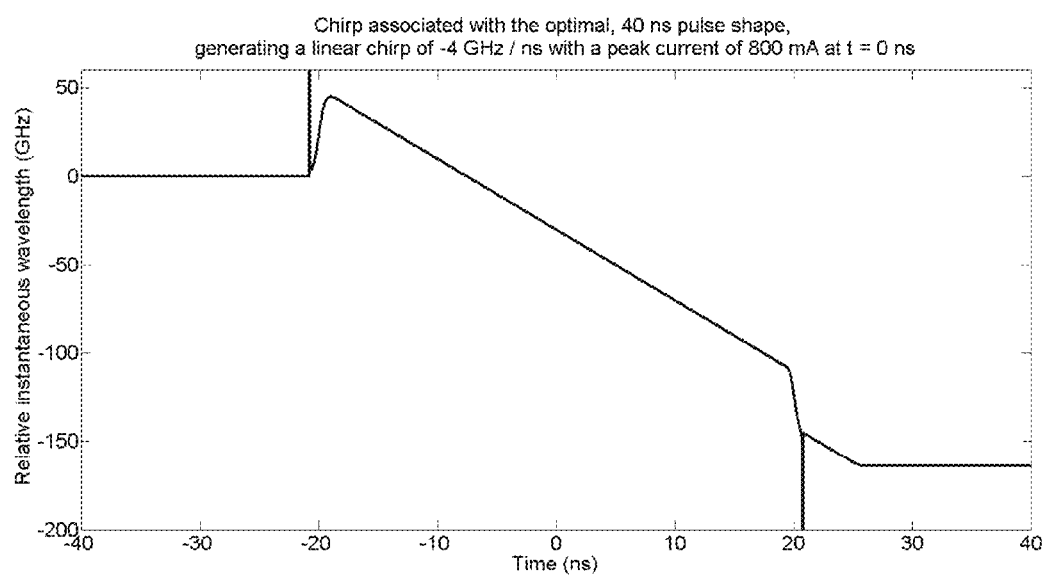
FIG. 6 is a graph showing the profile of the spectral chirp obtained for the optimal pulse shape at a peak current of 800 mA shown in FIG. 5B.

By way of example, a seed light pulse duration of 40 ns may be assumed, as well as a bandwidth of 350 MHz for the pulse generation module. FIGS. 5A and 5B illustrate the optimal seed light pulse shapes obtained iteratively to get constant, linear spectral chirp out of the seed diode of respectively −2 GHz/ns (FIG. 5A) and −4 GHz/ns (FIG. 5B) for different peak current levels. The profile of the spectral chirp for the seed light pulse shape obtained for a peak current of 800 mA (chirp of −4 GHz/ns) is illustrated in FIG. 6.

In some implementations, optimized seed light pulse shapes can be used to achieve the same level of chirp through a different balance of the three sources of chirp explained above.

Referring back to FIGS. 5A and 5B, it can be seen that in some implementations, to provide a negative spectral chirp, the seed light pulses may have a temporal shape defining, successively:
- a first portion with a fast rising edge, to minimize the fraction of energy associated with this part of the seed light pulse that cannot be properly linearized to generate a negative chirp;
- a downwardly sloped second portion, which uses the adiabatic chirp as its main contributor until the thermal chirp becomes significant;
- an upwardly sloped third portion—after the pulse duration exceeds the time delay associated with the response of the thermal chirp, an upward recovery in the pulse shape allows to cancel out the rising thermal chirp contribution;
- a fourth portion that is either:
  - steady if the thermal chirp is dominant and generating the required level of chirp without the need of over- or under-compensation
  - downwardly sloped if the thermal chirp is not generating enough chirp (low peak current) and the contribution of the adiabatic chirp is required; or
  - upwardly sloped if the contribution of the adiabatic chirp needs to increase to cancel out the rising thermal chirp because of the high peak current level; and
- A fifth portion with a fast falling edge, to minimize the fraction of energy associated with this part of the seed light pulse.

Figure 7:
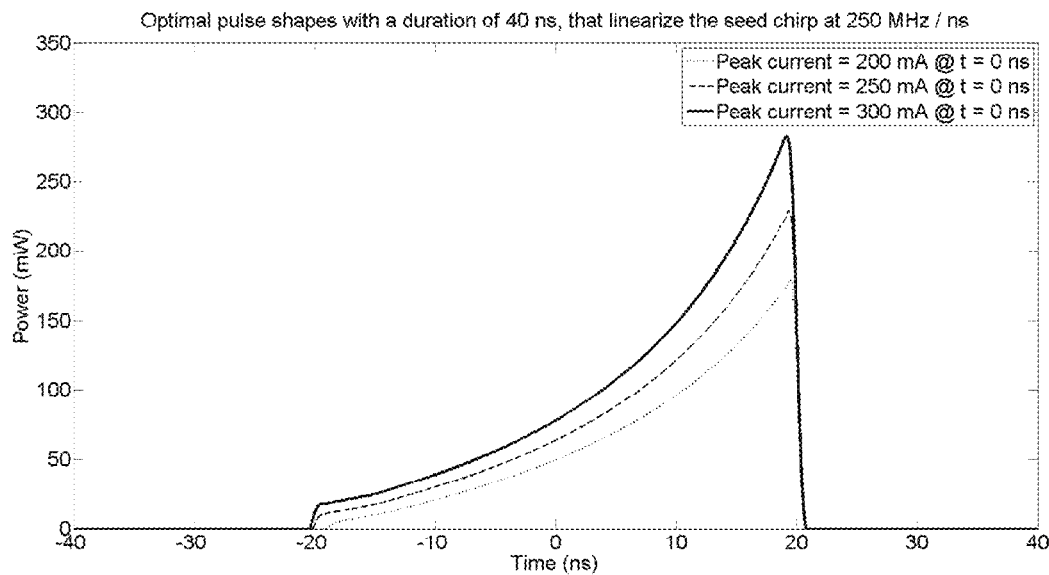
FIG. 7 is a graph showing simulated optimized pulse shapes for 40-ns seed light pulses that linearize the spectral chirp to a positive value of 250 MHz/ns.

Although examples above show a negative chirp value for the seed laser diode, it will be readily understood that in other embodiments positively chirped pulses can be used as well. Referring to FIG. 7, examples of seed light pulse shapes that linearize the chirp to +250 MHz/ns are shown. It will be observed that in these examples, the seed light pulses are generally continuously upwardly slopped so that the adiabatic chirp stays dominant throughout the pulse duration. While such seed light pulse shapes provide a lower chirp level lower (in absolute value) than in the previous examples, which limits the broadness of the generated spectrum, they could nonetheless be useful for some applications.

Referring back to FIG. 2, in some implementations, the step 104 of adapting the modulation signal to tailor the spectral chirp of the seed light pulses may involve a first substep of generating 106 the modulation signal according to an initial shape based on a modeling of the chirping properties of the laser diode. The modeling can for example be based on the considerations presented above for the transient, adiabatic and thermal chirp contributions. Next, the spectral chirp of the seed light pulses is monitored in substep 108. This substep may for example involve using a direct chirp measurement technique. In other variants, the optical spectrum and temporal envelope of the seed light pulses may alternatively be measured. This approach is based on the assumption that in cases where the spectral chirp of the seed light pulses is perfectly linear, the spectrum of the seed light pulses will have exactly the same shape as their temporal shape of the pulses, which is known as the condition of temporal far-field. The correlation between the spectrum and the temporal shape may be used as a figure of merit parameter. The adaptation of the modulation signal may finally include a substep 110 of iteratively correcting the modulation signal in view of the monitoring performed at the previous substep.

Maintaining a stable spectral chirp over a significant period of time could prove difficult as many factors could affect performance. For example, the aging of the seed laser diode will affect its chirp parameters, or the operating conditions (ambient temperature, humidity level, atmospheric pressure) could vary in time and affect either the diode itself or the drive electronics. Therefore, in some embodiments a continuously running algorithm, periodically trying to optimize the pulse shape, could be preferred for long term operation.

In exemplary systems embodying the concepts above, various module, sub-modules on or off-chip components etc, may be used to enable the adaptation of the modulation signal. Referring to FIG. 1, in some embodiments the pulse generating module 22 of the laser pulse generating system 20 may include a modeling sub-module 46 configured for modeling the chirped spectral profile of the seed light pulses and determine an initial shape of the modulation drive signal based on this modeling. The laser pulse generating system 20 may also include a correction loop 48 comprising a chirp monitoring mechanism 50 configured for monitoring the chirped spectral profile of the seed light pulses, and a correction mechanism 52 configured for iteratively correcting the modulation drive signal in view of this monitoring.

Referring back to FIG. 2, the method finally includes a step 112 of compressing the seed light pulses into the output light pulses having the target pulse duration, through propagation of these seed light pulses in the compression module.

As mentioned above, embodiments described herein may provide a compression of the seed light pulse very close to the transform-limited pulse duration, i.e. the minimum pulse duration physically achievable for light having a given spectral contents. By way of example, the achievable minimal pulse duration, after compression, as a function of the duration of the initial seed pulse can be estimated. The temporal Strehl ratio, given by the ratio of the peak power of the compressed pulse with the peak power of the equivalent transform-limited pulse to assess the quality of the compressibility of the pulses, can also be estimated.

Figure 8:
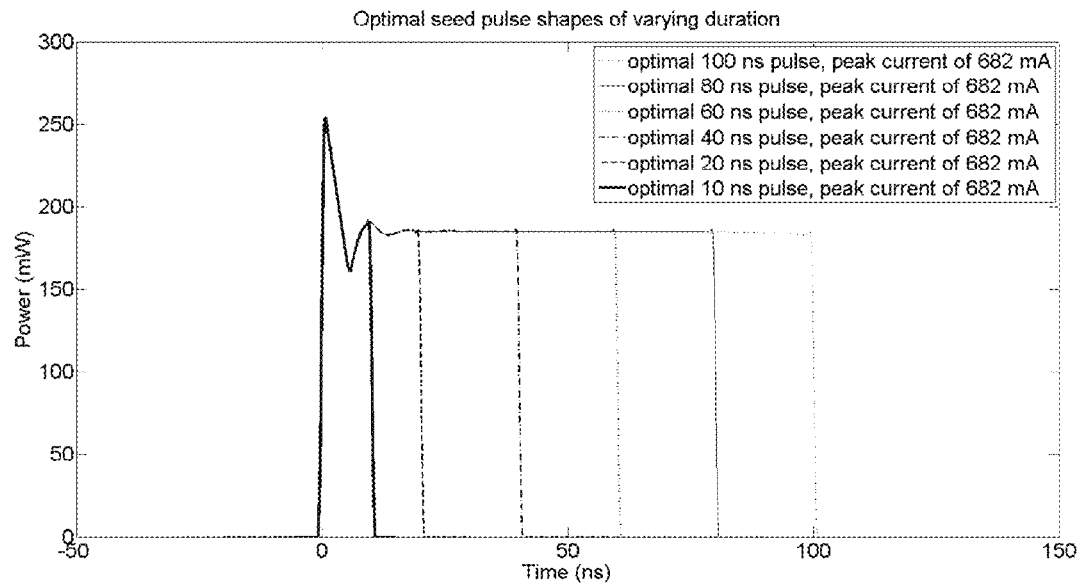
FIG. 8 is a graph showing simulated optimized seed pulse shapes of varying duration to create a chirp of −3 GHz/ns.
Figure 9:
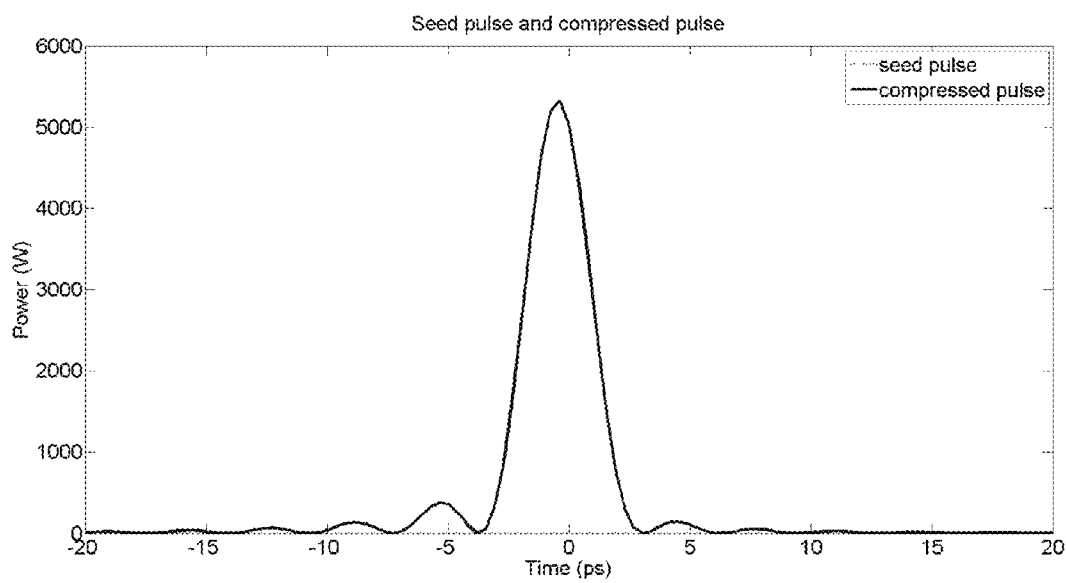
FIG. 9 is a graph showing a 3-ps pulse obtained after compression of an optimized 100-ns pulse with a chirp of −3 GHz/ns, illustrated on FIG. 8.

In an exemplary simulation a linear chirp of −3 GHz/ns was targeted and the peak current adjusted to 682 mA, a value known to provide a flat end of pulse in the portion where the thermal chirp is dominating. The total fiber Bragg dispersion was kept constant at −60.08 ps/nm, and the length of the fiber Bragg grating was varied depending on the duration of the seed light pulse. FIG. 8 illustrates the different seed optical pulses used in this numerical simulation. The pulses are reflected in a fiber Bragg grating of optimal length, such as defined in equation 7 above. FIG. 9 illustrates the compressed pulse obtained with a 100 ns seed optical pulse. It is to be noted that by using the model exposed above for the spectral chirp of the seed laser diode and the assumption of a fiber Bragg grating with an ideal linear chirp, pulses having a duration as short as 3 ps FWHM can be theoretically expected. The compression ratio in peak power has an impressive value of 21,000 and an excellent Strehl ratio of 0.93. The peak power from the seed optical pulses was 254 mW (power coupled into the pigtail optical fiber of the laser diode, assuming a coupling efficiency of 50%).

Figure 10A:
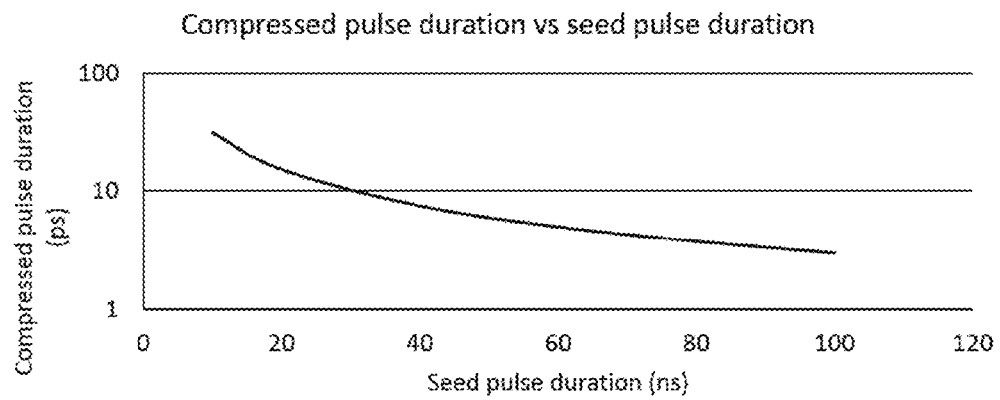
FIGS. 10A to 10C are graphs of the compressed pulse duration (FIG. 10A), compression factor (FIG. 10B) and temporal Strehl ratio (FIG. 10C) as a function of the seed light pulse duration illustrating compression performances simulated for a linear chirp of −3 GHz/ns.
Figure 10B:
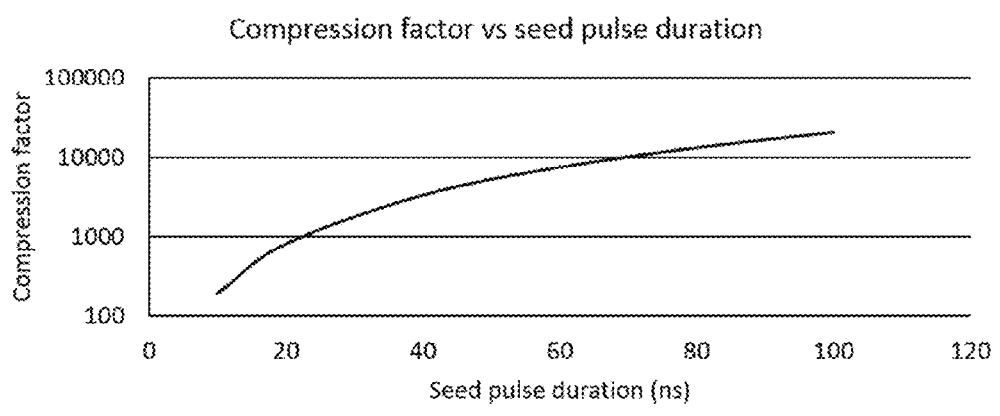
Figure 10C:
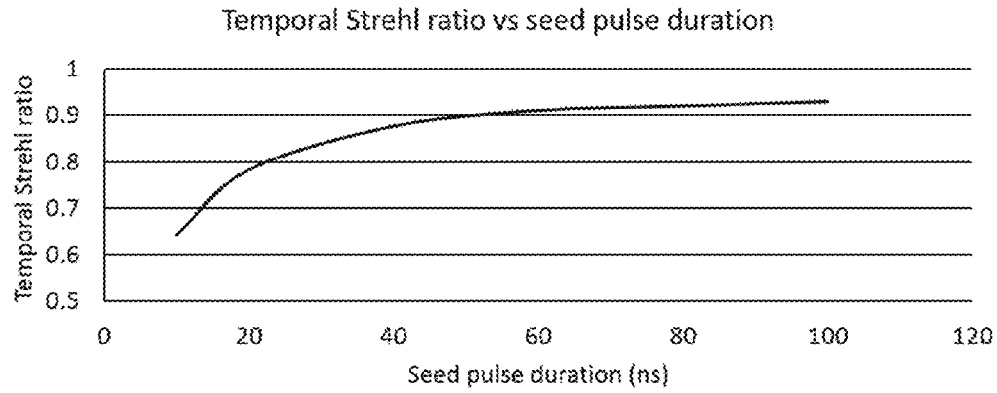

FIG. 10 illustrates the achievable performances as a function of the duration of the seed light pulse for the simulated conditions explained above. It can be observed that the longer the seed light pulse, the better the performances, that is, a shorter compressed pulse, a higher compression factor and an improved Strehl ratio are obtained. It is however to be noted that a compromise may have to be made between the need to maximize the duration of the seed light pulse and the difficulties in manufacturing Bragg grating of extended length, when the compression module is based on a long Bragg grating used in reflection.

As one skilled in the art will readily understand, the simulations reported above represent ideal cases, whereas in real-world applications the expected performance may be lesser than predicted. It is however believed that at least some of the inherent limitations of pulse compression can be mitigated by the use of an agile pulse generation module with a fine-pitch resolution and able to drive a seed diode in such a way as to linearize the spectral chirp of the seed light pulses. It is of note that an appropriate pulse shape can be generated regardless of the chirp parameters of the laser diode, even in the presence of second-order effects affecting this chirp which are not considered in the model laid out above.

Figure 11:
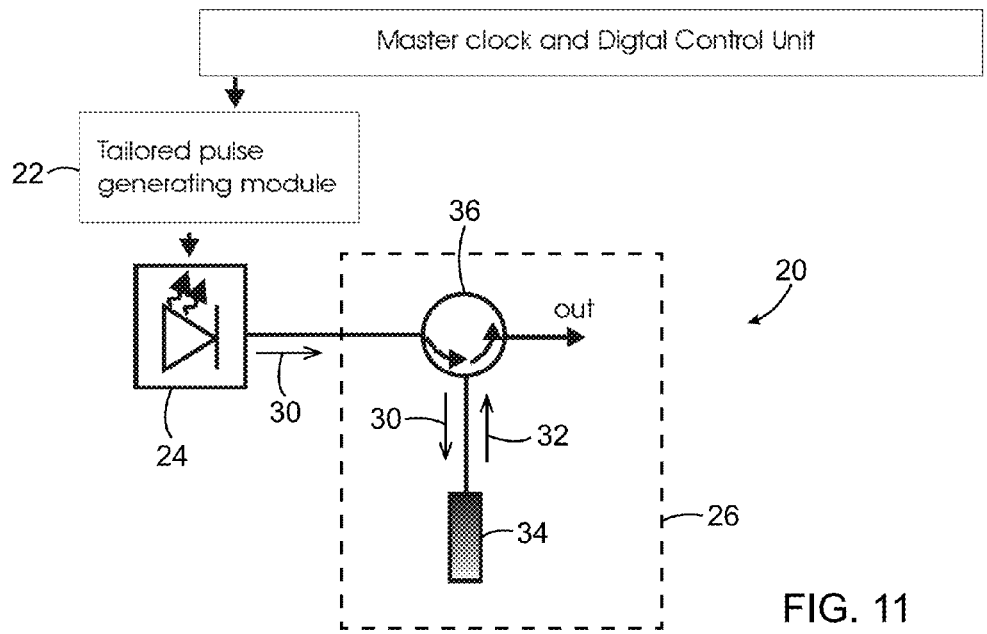
FIG. 11 is a schematized representation of a laser pulse generating system including a long Bragg grating according to one embodiment.

Referring to FIG. 11, a laser pulse generating system 20 according to one embodiment is schematically illustrated. In this embodiment the compression module 26 includes a long Bragg grating 34, preferably a fiber Bragg Grating (FBG), as mentioned above. The compression of the seed light pulses 30 therefore involves reflecting the seed light pulses 30 by the long Bragg grating 34. In the illustrated embodiment, the compression module 26 further includes an optical circulator 36 disposed in a path of the seed light pulses 30 from the seed light source 24, the optical circulator 36 directing the seed light pulses 30 towards the long Bragg grating 34 for reflection, and then redirecting the compressed output light pulses 32 out of the system 20.

Fiber Bragg gratings as long as 10 m may for example be fabricated by stitching together a large number of fiber Bragg gratings of conventional length, for example about 35 cm. High precision is typically needed to apply such a technique, as each fiber Bragg grating is to be placed in the fiber within a fraction of the Bragg wavelength one next to the other to create the effect of a single, very long Bragg grating. Other fabrication techniques resulting in suitable long Bragg gratings may alternatively be considered or developed.

As will be readily understood by one skilled in the art, numerous different configurations may be envisioned for the compression module.

Figure 12A:
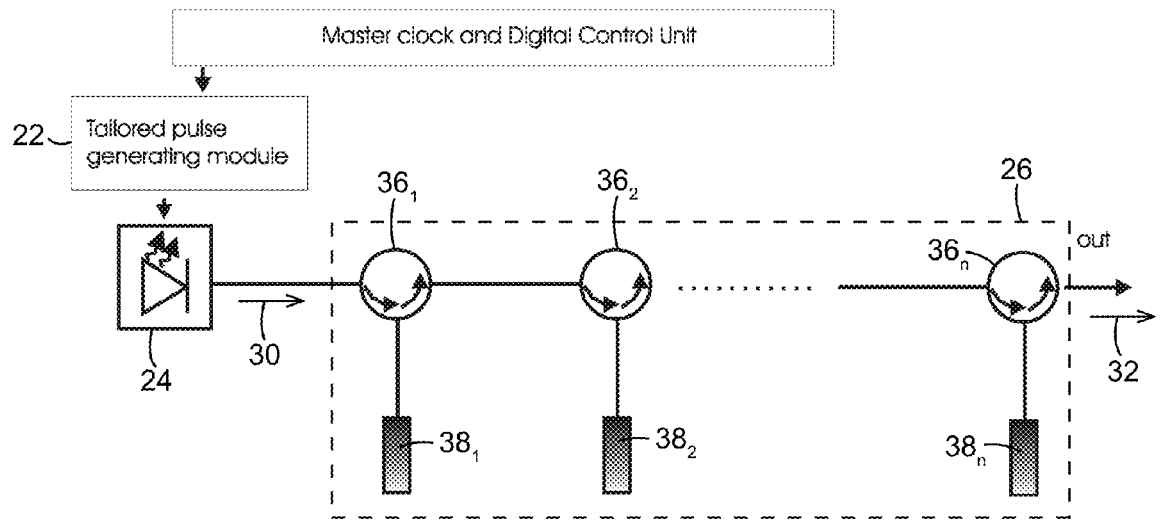
FIGS. 12A and 12B are schematized representations of laser pulse generating systems including Bragg grating segments arranged in cascade.
Figure 12B:
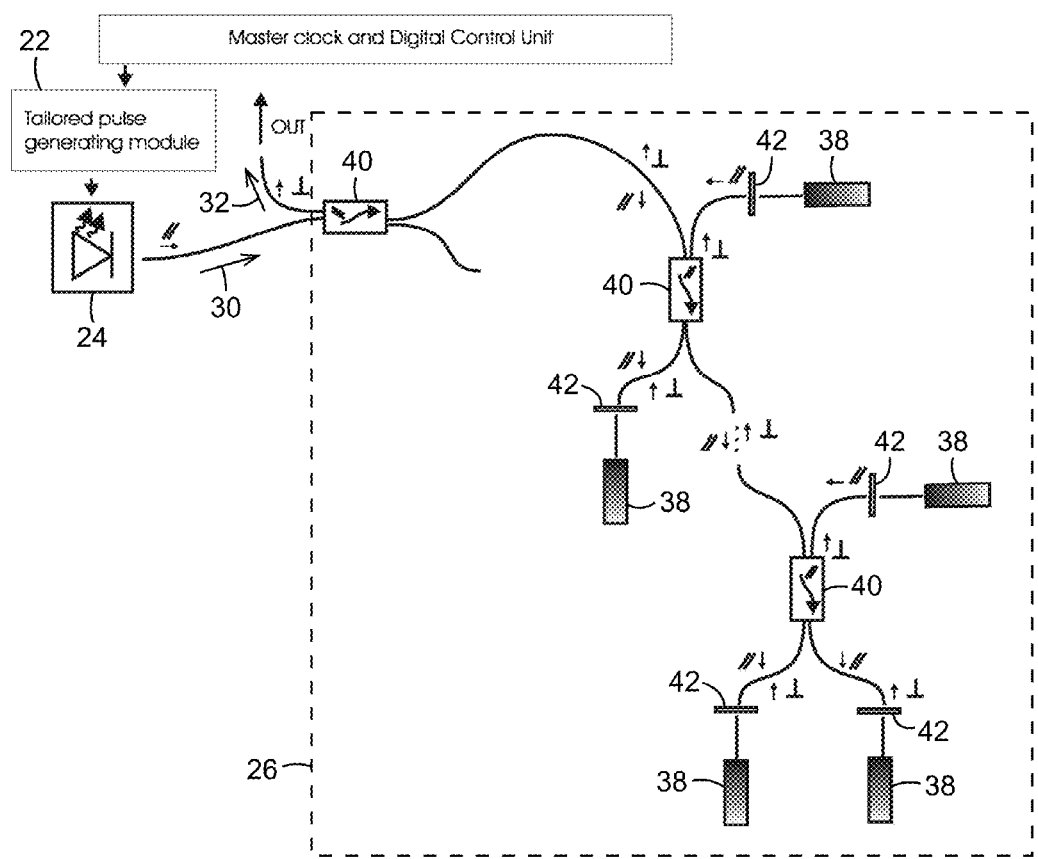

Referring to FIGS. 12A and 12B, in some embodiments, the compression module 26 may include a plurality of Bragg grating segments $38_1, 38_2, \ldots 38_n$ arranged in a cascade, such that the compression of the seed light pulses 30 involves sequentially reflecting the seed light pulses 30 by each of these Bragg grating segments 38. The seed light pulses 30 are therefore progressively compressed through successive propagation in each of the Bragg grating segments 38. This approach can be used to achieve the desired level of dispersion without the need for a long Bragg grating. FIGS. 12A and 12B illustrate schemes that could be used to cascade multiple fiber Bragg grating segments, by way of example. In the variant of FIG. 12A, a plurality of optical circulators $36_1, 36_2, \ldots, 36_n$ are disposed in series following the seed light source 24, each associated with one of the Bragg grating segments $38_1, 38_2, \ldots 38_n$. In the variant of FIG. 12B, a polarization-based scheme involving polarization splitters 40 and quarter wave plates 42 is illustrated. Of course, several other configurations could be imagined by one skilled in the art to direct the seed light pulses to each Bragg grating segment successively, and collect the compressed light after each reflection.

Referring to FIGS. 13A to 13F, in other implementations, the compression module 26 may include a one or more Bragg grating segment 38, and the compression of the seed light pulses 30 may involve reflecting the seed light pulses 30 by at least one of the Bragg grating segment for multiple passes. One or more active components may be provided to switch, route or modulate the seed light pulses to manage the multiple reflections. Examples of active elements include an electro-optic modulator, an acousto-optic modulator, an optical switch, a Nonlinear Optical Loop Mirror (NOLM), a Nonlinear Amplifying Loop Mirror (NALM), and the like. Typically, such an active element is used to block or reflect the intermediate pulses that have not been sufficiently compressed, yet route out or let pass the fully compressed output light pulses having the desired characteristics.

The configurations illustrated on FIGS. 13A to 13F have in common multiple reflections on one or several Bragg gratings segments. One aspect of such schemes is that it allows for the use of conventional fiber Bragg gratings of limited length, for example less than 50 cm, yet emulate the dispersion of a very long Bragg grating. Such configurations may however be lossy because of the insertion loss brought by the added components and the multiple passes. In some variants, it could be of interest to provide optical gain, compensating for the optical losses experienced on each pass.

Figure 13A:
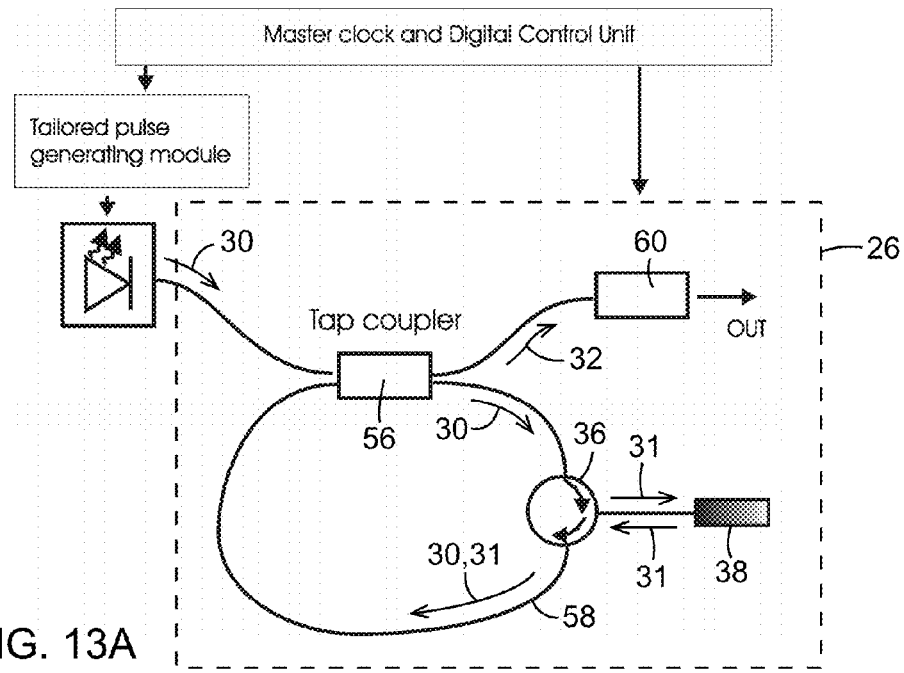
FIGS. 13A to 13F are schematized representations of variants of a laser pulse generating system involving multiple passes through one or more Bragg grating segments.

Specifically, FIG. 13A depicts a configuration that uses a tap coupler 56 to create a fiber-loop cavity 58 in which the seed light pulses 30 circulate. On each pass, a fraction 31 of the seed light pulse is compressed through reflection on the Bragg grating segment 38. Once the optimal number of reflections on the Bragg grating segment 38 has been reached a modulator 60 disposed at an output of the tap coupler 56 switches open for a short period of time, allowing the compressed pulse sent toward the modulator and defining the output light pulse 32 to continue downstream while other intermediate reflections are blocked. The coupling ratio of the tap coupler 56 may be selected for the number of passes required in order to maximize the pulse energy carried by the compressed pulse.

The energy of the compressed pulse is given by:

$$E_{compressed} = (1 - F_{circ}) F_{circ}^n g_{out} g_{circ}^n E_{seed} \tag{8}$$

where n is the number of passes, $F_{circ}$ is the fraction of power sent back in the fiber-loop cavity on each pass, $g_{circ}$ is the overall gain (or loss) experienced on each pass and $g_{out}$ is the gain (or loss) experienced on the exit branch of the tap coupler.

Figure 13B:
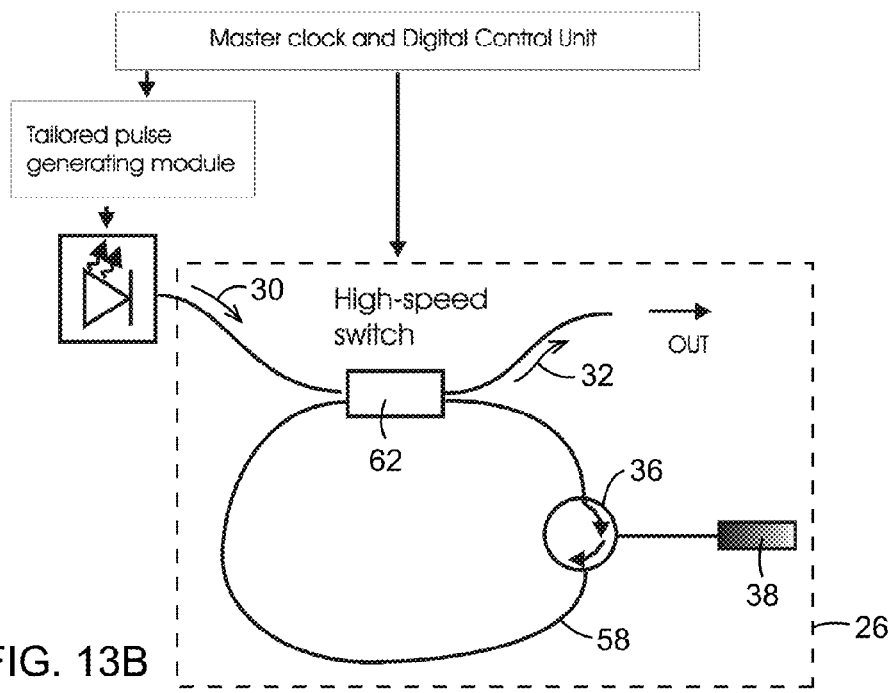

In the configuration show in FIG. 13B, the tap coupler is replaced by a high-speed switch 62 that routes the initial seed light pulse 30 in the fiber-loop cavity for the number of passes required and routes out the compressed pulse so it can continue downstream afterward.

Figure 13C:
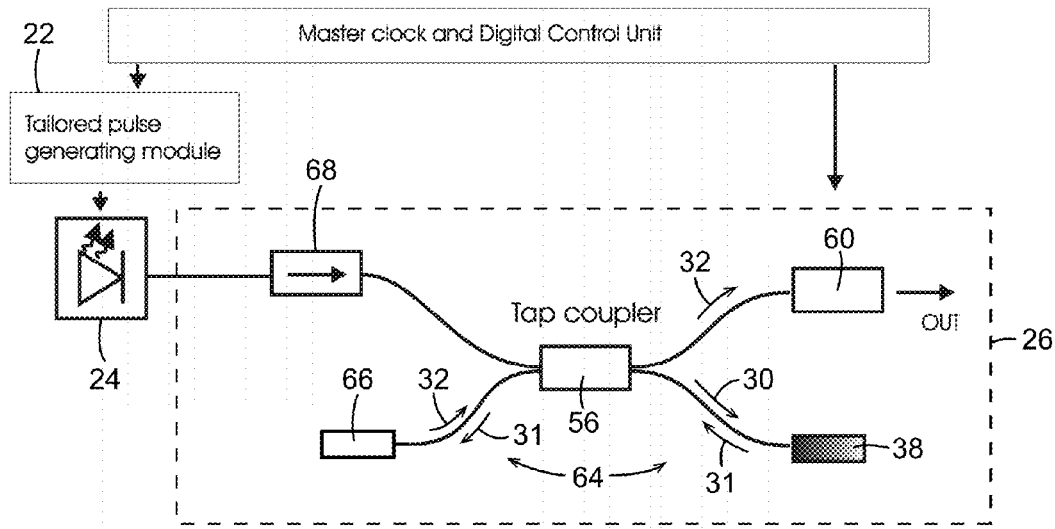

The configuration shown in FIG. 13C is similar to that of FIG. 13A except that the loop cavity is replaced by a linear cavity 64. A fraction 31 of the seed light pulse 30 is reflected on a Bragg grating segment 38, and split again while coming back toward the seed laser diode 24. One portion of the reflected pulse 31 is sent toward the laser diode 24 and is blocked on the way by an optical isolator 68. The other portion of the reflected pulse 31 is sent toward a secondary reflecting element 66, which can for example be embodied by a mirror or another fiber Bragg grating segment, the latter option further compressing the seed light pulse. The cycle may be repeated until the appropriate number of passes has been reached, at which point the modulator 60 lets the compressed output light pulse 32 out. Similarly to the configuration of FIG. 13A an optimal coupling ratio exists that will maximize the compressed pulse energy, such that:

$$E_{compressed} = (1-F_{circ})^2 F_{circ}^{2n-1} g_{out} g_{circ}^n E_{seed} \quad (8)$$

Figure 13D:
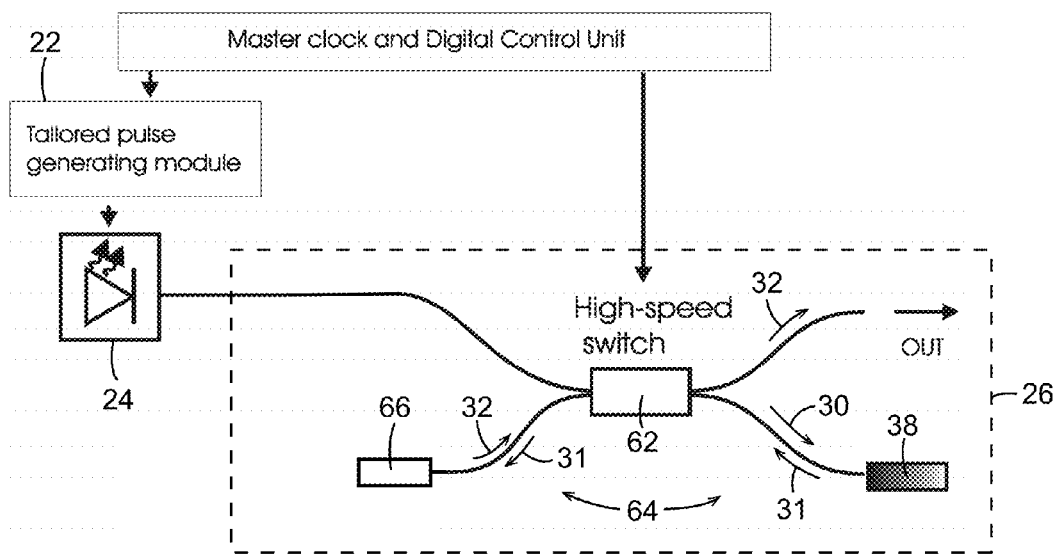

FIG. 13D illustrates a variant of the configuration of FIG. 13C where the tap coupler is replaced by a high-speed switch 62 routing appropriately the seed light pulse toward the Bragg grating segment 38 and toward the secondary reflecting element 66 until the optimal number of passes is reached, at which point the compressed output light pulse 32 is routed out of the linear cavity 64.

Figure 13E:
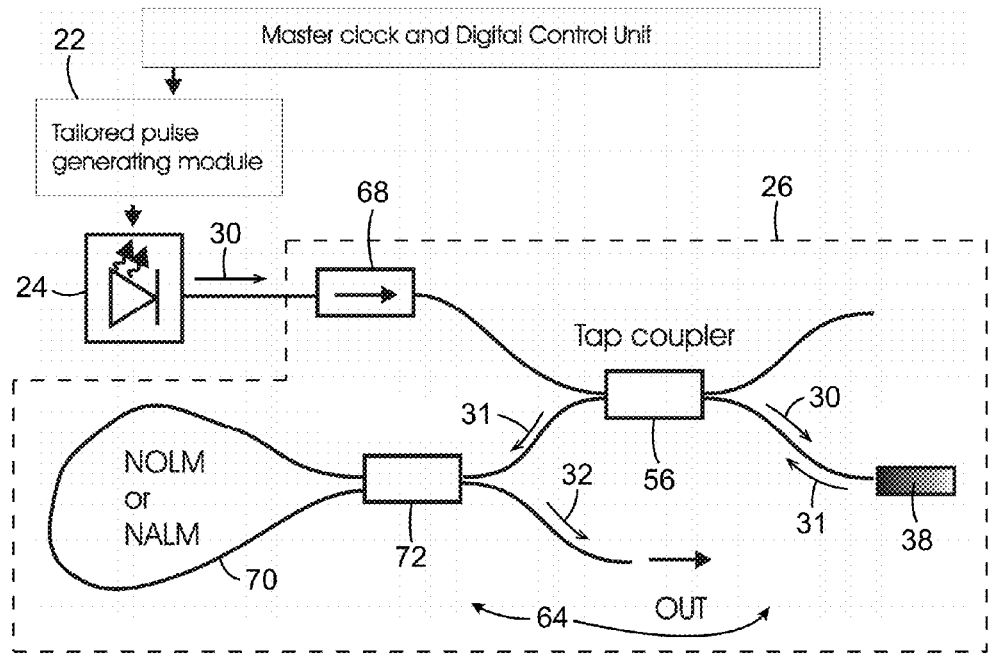

FIG. 13E illustrates yet another variant of the configuration of FIG. 13C where the secondary reflecting element is replaced by a nonlinear loop mirror 70 such as a nonlinear optical loop mirror (NOLM) or a nonlinear amplifying loop mirror (NALM), coupled in the second branch of the linear cavity 64 through a secondary tap coupler 72. A nonlinear loop mirror 70 has the property of behaving like a mirror at low peak power, reflecting the reflected light pulse 30 from the Bragg grating segment 38 back in the linear cavity 64, and as a fully transparent output coupler for a certain peak power level. If the nonlinear loop mirror is properly configured, it can switch out the compressed pulse 32 (high peak power) passively with minimal losses and without any active intervention, at the right moment.

Figure 13F:
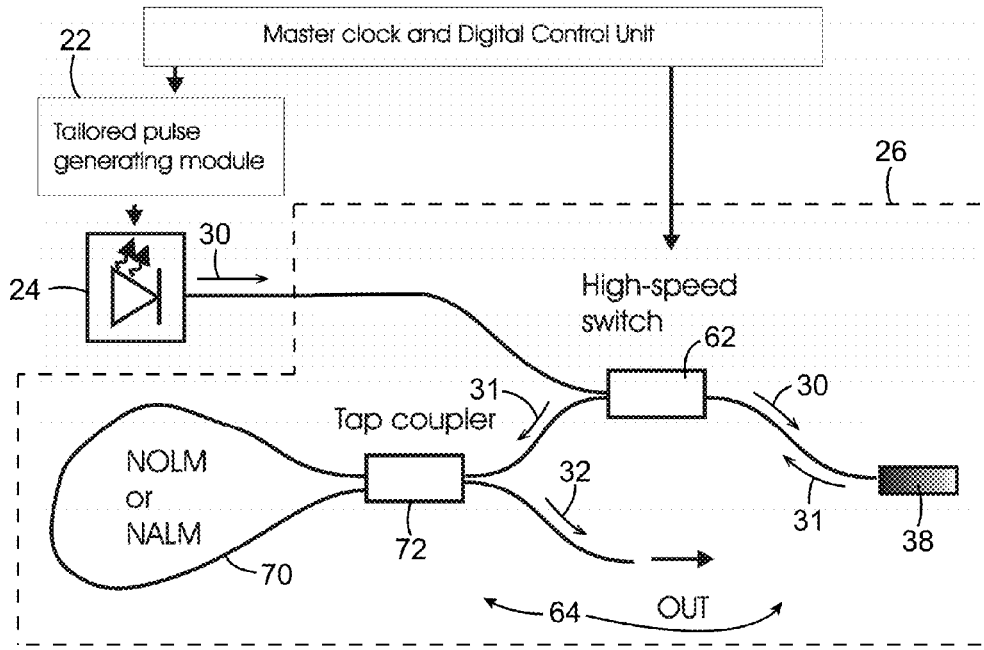

FIG. 13F illustrates a variant of the configuration of FIG. 13E where the tap coupler 56 is replaced by a high-speed switch 62.

Figure 14:
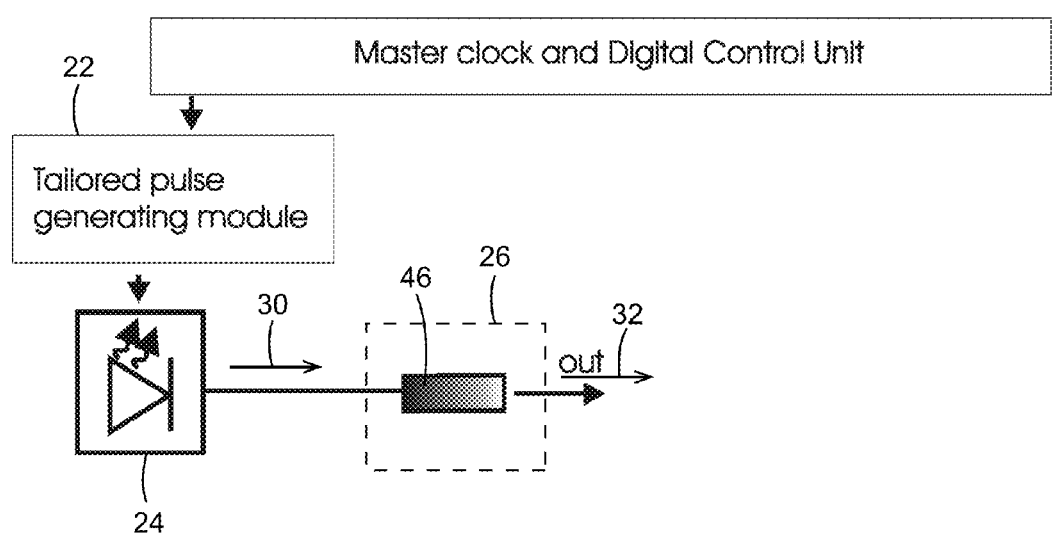
FIG. 14 is a schematized representation of a laser pulse generating system including a Bragg grating used in transmission.

Referring to FIG. 14, in accordance with yet another implementation, the compression module 26 may include one or more Bragg gratings 46 exhibiting the dispersion characteristics in transmission, and the compression of the seed light pulses 30 involves propagating the seed light pulses 30 in transmission through this Bragg grating 46.

Generally, a fiber Bragg grating characterized by a strong reflection band exhibits high dispersion in transmission, very close spectrally to the reflection band (but not within). Suitable fiber Bragg gratings can for example be produced by the point by point writing technique using femtosecond lasers. The resulting dispersion is typically not linear and not as significant as what can be generated with a chirped fiber Bragg grating used in reflection. However, this dispersion may be sufficient for some applications, and the non-linearity of the dispersion may be addressed through proper pulse shaping of the seed light pulses to exhibit the same non-linear spectral chirp.

Use of the Pulse Generating System and Method for Chirped Pulse Amplification

The embodiments of methods and systems described above have been applied to the case where the target duration of the output light pulses is in the picosecond or femtosecond range, and techniques to obtain the shortest possible pulses were explained. It will however be readily understood that in some implementations pulses of a duration greater than the shortest possible optical pulses could be useful. One example of such implementations could be to use the system described above or the like as a wavelength-tunable seed in a Chirped Pulse Amplification (CPA) system.

CPA is commonly used to achieve very high peak power from optical amplifying chains. The last stage of compression of CPA amplifying chains is usually a grating pair compressor or a volume Bragg grating because of their very high damage threshold resulting from the dimensions of the components that can be scaled to keep the optical intensities within a safe range.

Generally, the level of dispersion that CPA devices can generate is somewhat modest, and the maximum pulse duration prior to compression is of the order of 1 ns or less. That is where the tunability of the short-pulse generating scheme described herein can be of interest. By over compressing or under compressing long initial seed pulses, for example of 100 ns or more, one can end with pulses of a shorter duration (1 ns for example), still having a linear chirp, and ready to be further amplified in a classical CPA-based amplifying chain.

A CPA-based amplifying chain as a source of high peak optical power is operated very close to the onset of nonlinear effects such as self phase modulation (SPM) or stimulated Brillouin scattering (SRS). Consequently, the pulse under amplification can acquire additional chirp components that are not necessarily linear. Furthermore, propagation in optical fiber is accompanied by a significant level of chromatic dispersion that is also not necessarily linear, depending on the fiber geometry and characteristics of the seed pulse. Compressor dispersion usually comes as well with significant cubic dispersion.

Designers of CPA-based amplifying chains need to take into consideration all those contributors to the system dispersion and make the most sensible choice of components and operating conditions to manage properly the dispersion and the accumulated nonlinear effects to eventually achieve fully compressed pulses with high peak power.

Advantageously, embodiments of the invention such as described herein may help to alleviate some of these drawbacks of CPA-based systems as the fine control of the shape of the modulation signal can be used to optimize the spectral chirp of the seed light pulses to match all the dispersive components of the CPA-amplifier, and compensate as well for the chirp acquired through nonlinear effects experienced during the propagation of the pulses. In some implementations, the final pulse duration could be used as the figure of merit parameter on which the iterative optimizing of the seed pulse shape relies.

Figures 15A, 15B:
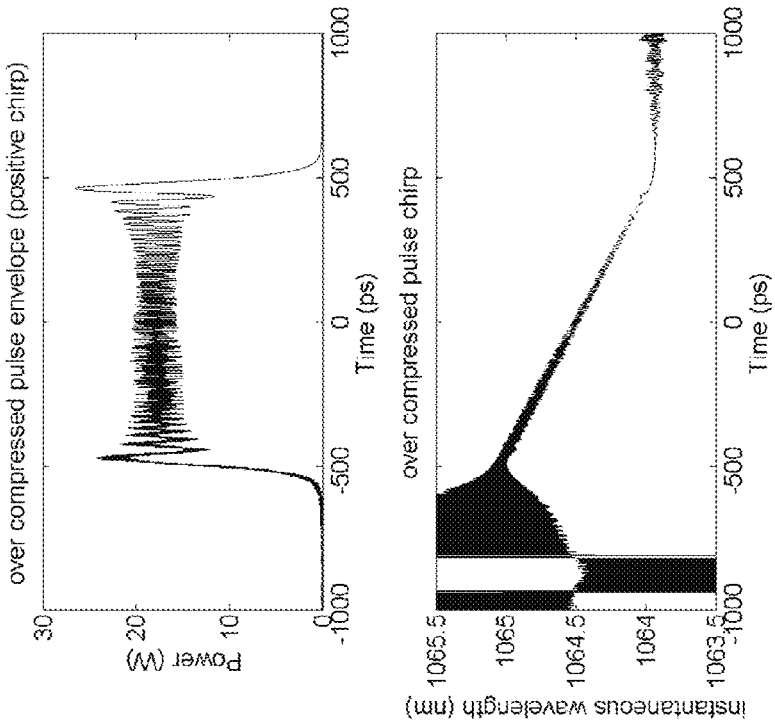
FIGS. 15A and 15C are graphs respectively illustrating the output power and the instantaneous wavelength of a 1-ns output light pulse with a negative linear chirp, generated by under-compressing an initial 100-ns seed light pulse.
FIGS. 15B and 15D respectively illustrate the output power and the instantaneous wavelength of a 1-ns output light pulse with a positive linear chirp, generated by over-compressing an initial 100-ns seed light pulse.
Figures 15C, 15D:
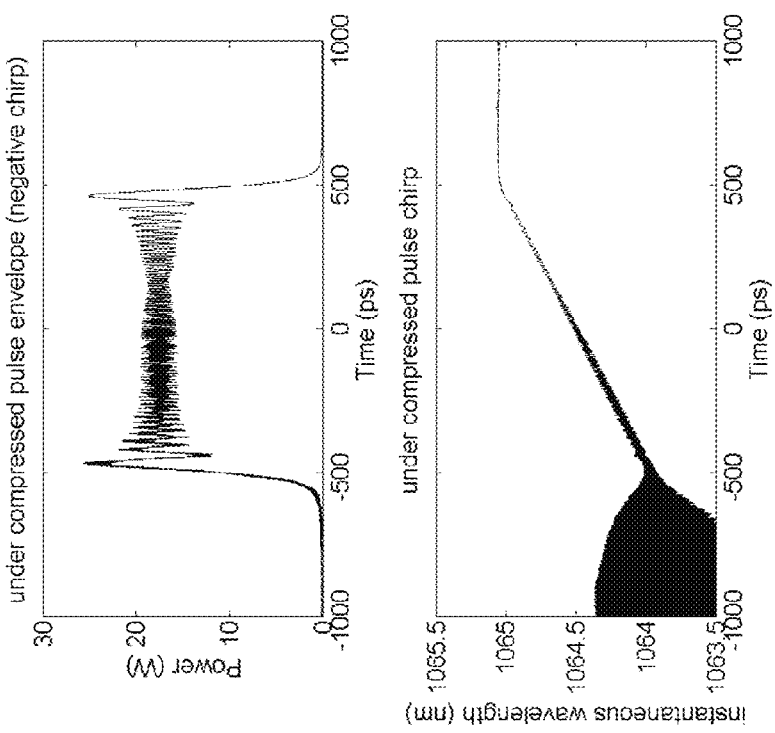
Figure 16:
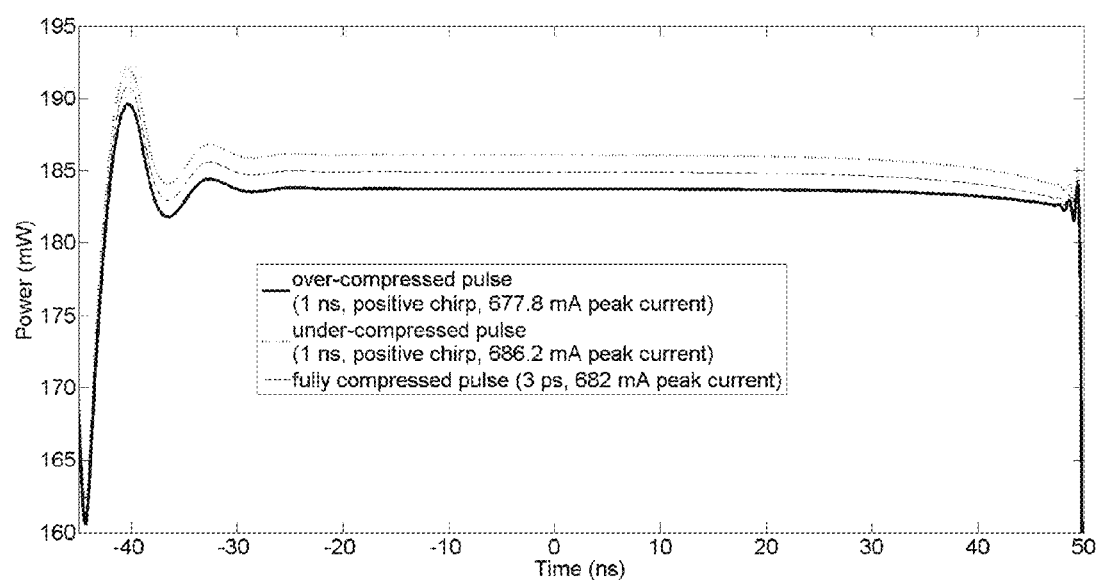
FIG. 16 is a graph illustrating 100-ns seed light pulses suited to generate over-compressed and under-compressed pulses of 1-ns duration, as well as a seed pulse shape providing a fully compressed pulse, with the same fiber Bragg grating.

Referring to FIGS. 15A and 15C, there are shown graphs respectively illustrating the output power and the instantaneous wavelength of a 1-ns output light pulse with a negative linear chirp, generated by under-compressing an initial 100-ns seed light pulse. FIGS. 15B and 15D respectively illustrate the output power and the instantaneous wavelength of a 1-ns output light pulse with a positive linear chirp, generated by over-compressing an initial 100-ns seed light pulse. Both results were obtained using the same fiber Bragg grating and by simply tuning the seed pulse shape to control the degree of initial spectral chirp. FIG. 16 presents those two slightly different seed pulse shapes as well as the seed pulse shape required to achieve full compression. It is to be noted that the same result could have been obtained by changing the dispersion of the fiber Bragg grating and keeping the seed pulse shape constant.

It can be deduced from FIG. 16 that the spectral chirp of the seed laser diode can be very sensitive to the power level at which the diode is operated. In the presented example, only 8.4 mA of peak current are separating the over-compressed seed pulse (1 ns, negative chirp after compression) and the under-compressed seed pulse (1 ns, positive chirp) with the seed shape required to produce the fully compressed pulse in between. Very precise, delicate and stable pulse shaping can therefore be advantageous to obtain the best performances from embodiments of the systems and methods described above.

Of course, numerous modifications could be made to the embodiments described above without departing from the scope of the present invention, as defined in the appended claims.

The invention claimed is:

1. A method for generating output light pulses having a target pulse duration using a seed laser diode and using a compression module having dispersion characteristics over a broad spectral range, the method comprising:
   a) directly modulating a drive current of the seed laser diode with a modulation signal such that the seed laser diode generates seed light pulses having a pulse duration larger than the target pulse duration and a spectral chirp along said pulse duration;
   b) adapting the modulation signal to tailor the spectral chirp of the seed light pulses in view of the dispersion characteristics of the compression module; and
   c) compressing the seed light pulses into said output light pulses having the target pulse duration through propagation in the compression module.

2. The method according to claim 1, wherein the step of adapting the modulation signal comprises:
   generating the modulation signal according to an initial shape based on a modeling of chirping properties of the seed laser diode;
   monitoring the spectral chirp of the seed light pulses;
   iteratively correcting the modulation signal in view of said monitoring.

3. The method according to claim 2, wherein the monitoring of the spectral chirp of the seed light pulses comprises using a direct chirp measurement technique.

4. The method according to claim 2, wherein the monitoring of the spectral chirp of the seed light pulses comprises measuring an optical spectrum and a temporal envelope of the seed light pulses.

5. The method according to claim 1, wherein the spectral chirp of the seed light pulses is generally linear.

6. The method according to claim 5, wherein the spectral chirp of the seed light pulses defines a constant chirp rate between −50 GHz/ns and +5 GHz/ns.

7. The method according to claim 5, wherein the spectral chirp of the seed light pulses defines a negative chirp rate, and the modulation signal defines electrical drive pulses producing seed light pulses each having a temporal shape defining, successively:
   a first portion with a fast rising edge;
   a downwardly sloped second portion;
   an upwardly sloped third portion;
   a fourth portion that is either steady, downwardly sloped or upwardly sloped; and
   a fifth portion with a fast falling edge.

8. The method according to claim 1, wherein the dispersion characteristics of the compression module comprise a constant dispersion value over the broad spectral range of the chirped spectral profile of the seed light pulses.

9. The method according to claim 1, wherein the compression module comprises a long Bragg grating, the step of compressing the seed light pulses comprising reflecting the seed light pulses by said long Bragg grating.

10. The method according to claim 1, wherein the target duration of the output light pulses is between 100 femtoseconds and 50 picoseconds.

11. A laser pulse generating system for generating output light pulses having a target pulse duration, comprising:
   a pulse generation module configured to generate a modulation signal;
   a seed laser diode configured to generate seed light pulses in response to direct drive current modulation by said modulation signal, the seed light pulses having a pulse duration larger than the target pulse duration and a spectral chirp along said pulse duration;
   a compression module optically connected to the seed laser diode to receive the seed light pulses, the compression module having dispersion characteristics over a broad spectral range;
   wherein the pulse generation module is configured to adapt the modulation signal to tailor the spectral chirp of the seed light pulses in view of the dispersion characteristics of the compression module, such that propagation of the seed light pulses through the compression module compresses the seed pulses into said output light pulses having the target pulse duration.

12. The laser pulse generating system according to claim 11, wherein the seed laser diode is one of a Distributed Feed-Back laser diode, a Distributed Bragg Reflector laser diode or a Vertical-Cavity Surface Emitting Laser diode.

13. The laser pulse generating system according to claim 11, wherein the pulse generation module comprises a modeling sub-module configured for modeling the chirped spectral profile of the seed light pulses and determine an initial shape of the modulation drive signal based on said modeling.

14. The laser pulse generating system according to claim 13, comprising a correction loop comprising a chirp monitoring mechanism configured for monitoring the chirped spectral profile of the seed light pulses and a correction mechanism configured for iteratively correcting the modulation drive signal in view of said monitoring.

15. The laser pulse generating system according to claim 11, wherein the spectral chirp of the seed light pulses is generally linear and defines a negative chirp rate, and the modulation drive signal defines electrical drive pulses producing seed light pulses each have a temporal shape defining, successively:
   a first portion with a fast rising edge;
   a downwardly sloped second portion;
   an upwardly sloped third portion; and
   a fourth portion that is either steady, downwardly sloped or upwardly sloped; and
   a fifth portion with a fast falling edge.

16. The laser pulse generating system according to claim 11, wherein the compression module comprises a long Bragg grating, the compressing the seed light pulses comprising reflecting the seed light pulses by said long Bragg grating.

17. The laser pulse generating system according to claim 16, wherein the long Bragg grating has a length of at least 1 m.

18. The laser pulse generating system according to claim 11, wherein the compression module comprises a plurality of Bragg grating segments arranged in a cascade, the compressing the seed light pulses comprising sequentially reflecting the seed light pulses by said plurality of Bragg grating segments.

19. The laser pulse generating system according to claim 11, wherein the compression module comprises a Bragg grating segment, and the compressing the seed light pulses comprises reflecting the seed light pulses by said Bragg grating segment for multiple passes.

20. The laser pulse generating system according to claim 11, wherein the compression module comprises a Bragg grating exhibiting the dispersion characteristics in transmission, and the step of compressing the seed light pulses comprises propagating the seed light pulses in transmission through said Bragg grating.

* * * * *